United States Patent
Ogura et al.

(10) Patent No.: US 10,032,874 B2
(45) Date of Patent: Jul. 24, 2018

(54) SEMICONDUCTOR DEVICE WITH REDUCED ON-STATE RESISTANCE

(71) Applicant: KABUSHIKI KAISHA TOSHIBA, Tokyo (JP)

(72) Inventors: Tsuneo Ogura, Kamakura Kanagawa (JP); Tomoko Matsudai, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/250,565

(22) Filed: Aug. 29, 2016

(65) Prior Publication Data

US 2017/0263714 A1     Sep. 14, 2017

(30) Foreign Application Priority Data

Mar. 14, 2016 (JP) .................. 2016-050055

(51) Int. Cl.
*H01L 29/36* (2006.01)
*H01L 29/739* (2006.01)
*H03K 17/06* (2006.01)

(52) U.S. Cl.
CPC .......... *H01L 29/36* (2013.01); *H01L 29/7393* (2013.01); *H03K 17/063* (2013.01)

(58) Field of Classification Search
CPC ............. H01L 29/7393; H01L 29/7395; H01L 29/7397; H01L 29/1095; H01L 29/7813; H01L 29/66333; H01L 29/66348; H01L 2924/13055; H01L 29/36
See application file for complete search history.

(56) References Cited

U.S. PATENT DOCUMENTS

2004/0021173 A1* 2/2004 Sapp ................... H01L 29/7813
257/330

FOREIGN PATENT DOCUMENTS

| JP | 2008-021918 A | 1/2008 |
| JP | 2011-165971 A | 8/2011 |
| JP | 2013-161918 A | 8/2013 |

* cited by examiner

*Primary Examiner* — Tucker J Wright
(74) *Attorney, Agent, or Firm* — Patterson & Sheridan, LLP

(57) ABSTRACT

A semiconductor device includes first and second electrodes spaced apart along a first direction, a first semiconductor region of a first conductivity type between the first and second electrodes, first and second conductive regions between the first semiconductor region and the second electrode and electrically connected to the second electrode, a third electrode between the first and second conductive regions, second and third semiconductor regions of a second conductivity type respectively between the first and second conductive regions and the third electrode, and fourth and fifth semiconductor regions of the first conductivity type respectively between the second and third semiconductor regions and the second electrode. The third electrode extends in the first direction toward the first electrode farther than portions of the second and third semiconductor regions that are alongside the third electrode.

15 Claims, 35 Drawing Sheets

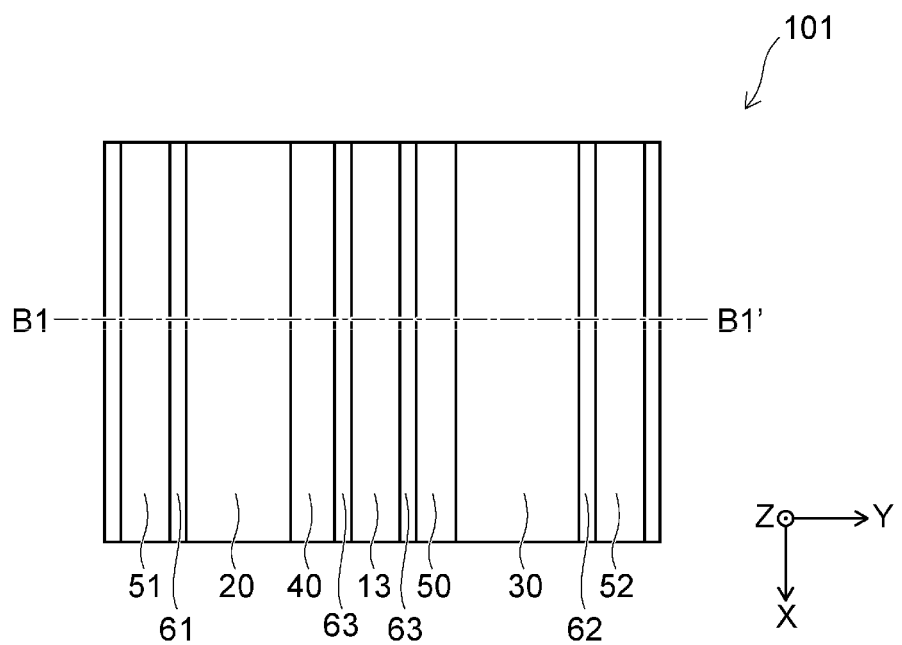

SEMICONDUCTOR DEVICE WITH REDUCED ON-STATE RESISTANCE

CROSS-REFERENCE TO RELATED APPLICATION

This application is based upon and claims the benefit of priority from Japanese Patent Application No. 2016-050055, filed Mar. 14, 2016, the entire contents of which are incorporated herein by reference.

FIELD

Embodiments described herein relate generally to a semiconductor device.

BACKGROUND

An IGBT (Insulated Gate Bipolar Transistor) has been employed in a power semiconductor device. In a case where the IGBT is used as a switch, it is desirable that an ON-state resistance be low, and a switching speed be high.

When a gap of trench gates of the IGBT becomes narrow, an n type base region provided between the trench gates is increased in resistance. Therefore, an IE (Injection Enhanced) effect is generated, and the ON-state resistance of the IGBT becomes small.

However, the aspect ratio of the trench gate becomes high as the gap of the trench gates becomes narrow, and the manufacturing of the IGBT becomes difficult. Furthermore, when the trench gate is shallow, the IE effect is reduced, and the ON-state resistance is increased.

DESCRIPTION OF THE DRAWINGS

FIGS. 1A and 1B are diagrams illustrating a semiconductor device according to a first embodiment.

DETAILED DESCRIPTION

Figure 1A:
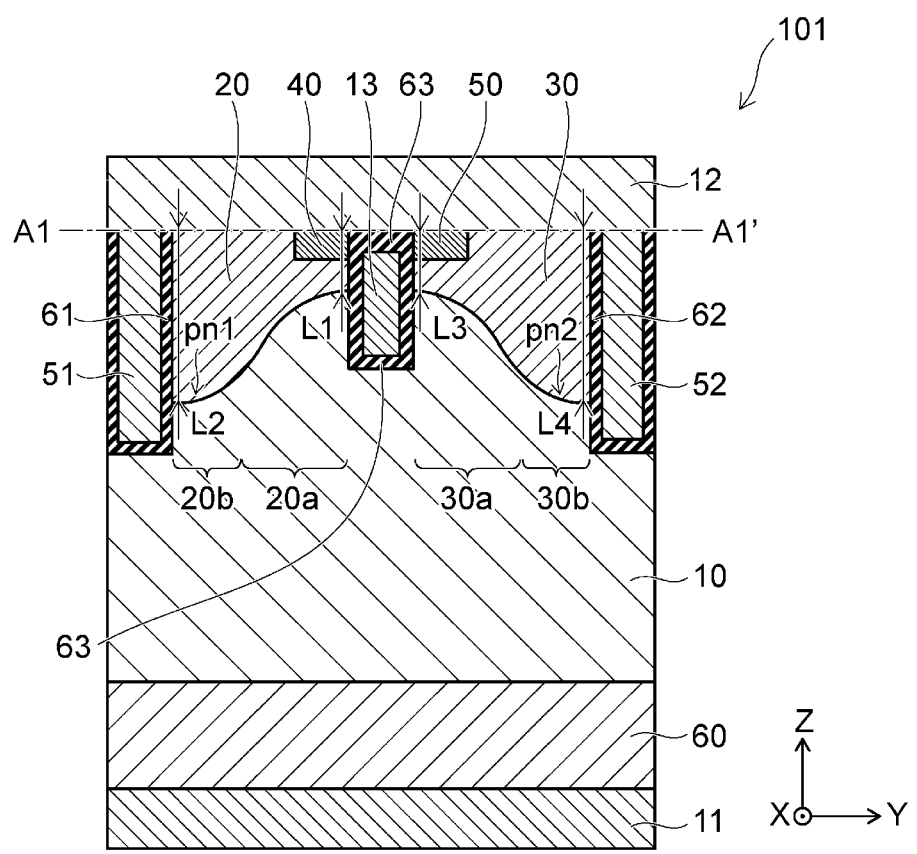

According to an embodiment, there is provided a semiconductor device in which an ON-state resistance can be reduced.

In general, according to one embodiment, a semiconductor device includes a first electrode, a second electrode spaced from the first electrode along a first direction, a first semiconductor region of a first conductivity type between the first electrode and the second electrode, a first conductive region between the first semiconductor region and the second electrode and electrically connected to the second electrode, a second conductive region between the first semiconductor region and the second electrode, aligned with the first conductive region in a second direction intersecting with the first direction and electrically connected to the second electrode, a third electrode between the first conductive region and the second conductive region and shorter in the first direction than each of the first and second conductive regions, a second semiconductor region of a second conductivity type between the first conductive region and the third electrode, a third semiconductor region of the second conductivity type between the second conductive region and the third electrode, a fourth semiconductor region of the first conductivity type between the second semiconductor region and the second electrode, a fifth semiconductor region of the first conductivity type between the third semiconductor region and the second electrode, a first insulating film between the first conductive region and the second semiconductor region, a second insulating film between the second conductive region and the third semiconductor region, and a third insulating film between the third electrode and the second semiconductor region and between the third electrode and the third semiconductor region. A first portion of the second semiconductor region that is alongside the first insulating film extends farther in the first direction toward the first electrode than a second portion of the second semiconductor region that is alongside the third insulating film, and a first portion of the third semiconductor region that is alongside the second insulating film extends farther in the first direction toward the first electrode than a second portion of the third semiconductor region that is alongside the third insulating film.

Hereinafter, embodiments will be described with reference to the drawings. In the following description, the same components will have attached thereto the same symbols, and the descriptions of the already described components will be appropriately omitted. The drawings are drawn schematically and conceptually, and dimensions of the respective components are not necessarily exactly the same as actual ones. The dimensions and ratios of even the same component may be differently illustrated from each other depending on the drawings.

In the embodiment, an impurity concentration of an n+ type is higher than that of an n type. An impurity concentration of a p+ type is higher than that of a p type. In addition, in the drawings, three-dimensional coordinates (X axis, Y axis, and Z axis) may be introduced. In such cases, the X axis is intersected with the Y axis and the Z axis, and the Y axis is intersected with the Z axis.

First Embodiment

FIGS. 1A and 1B are diagrams illustrating a semiconductor device according to a first embodiment. FIG. 1A illustrates a cross-sectional view taken along a line B1-B1' in FIG. 1B. FIG. 1B illustrates a cross-sectional view taken along a line A1-A1' in FIG. 1A.

A semiconductor device 101 according to the first embodiment is provided with a first electrode (e.g., a collector electrode 11), a second electrode (e.g., an emitter electrode 12), a first semiconductor region of a first conductivity type (e.g., an n type base region 10), a first connection region 51 formed of conductive material, a second connection region 52 formed on conductive material, a third electrode (e.g., a gate electrode 13), a second semiconductor region of a second conductivity type (e.g., a p type base region 20), a third semiconductor region of the second conductivity type (e.g., a p type base region 30), a fourth semiconductor region of the first conductivity type (e.g., an n+ type emitter region 40), a fifth semiconductor region of the first conductivity type (e.g., an n+ type emitter region 50), a sixth semiconductor region of the second conductivity type (e.g., a p+ type collector region 60), a first insulating film (e.g., an insulating film 61), a second insulating film (e.g., an insulating film 62), and a third insulating film (e.g., a gate insulating film 63). The semiconductor device 101 is an IGBT for example.

The Z axis direction corresponds to a direction from the first electrode 11 toward the second electrode 12. The Y axis direction corresponds to a direction from the first connection region 51 toward the second connection region 52 and is orthogonal to the Z axis direction. The X axis direction is orthogonal to the Y axis and Z axis directions.

The n type base region 10 is provided between the first electrode 11 and the second electrode 12 in the Z axis direction. The n type base region 10 extends in the X axis direction. The p+ type collector region 60 is provided between the first electrode 11 and then type base region 10 in the Z axis direction. The p+ type collector region 60 is electrically connected to the first electrode 11. The p+ type collector region 60 extends in the X axis direction. The p+ type collector region 60 abuts the n type base region 10 and the first electrode 11.

The first connection region 51 is provided between the n type base region 10 and the second electrode 12 in the Z axis direction. The first connection region 51 is electrically connected to the second electrode 12. The first connection region 51 abuts the second electrode 12. The first connection region 51 has a predetermined length in the Z axis direction. The first connection region 51 extends in the X axis direction. The length of the first connection region 51 in the Z axis direction is 4 μm to 10 μm for example.

The second connection region 52 is provided between the n type base region 10 and the second electrode 12 in the Z axis direction. The second connection region 52 is aligned with the first connection region 51 in the Y axis direction. The second connection region 52 is electrically connected to the second electrode 12. The second connection region 52 abuts the second electrode 12. The second connection region 52 has a predetermined length in the Z axis direction. The second connection region 52 extends in the X axis direction. The length of the second connection region 52 in the Z axis direction is 4 μm to 10 μm for example. A distance between the center of the first connection region 51 and the center of the second connection region 52 in the Y axis direction is 2 μm to 12 μm for example.

The gate electrode 13 is positioned between the first connection region 51 and the second connection region 52 in the Y axis direction. The gate electrode 13 is provided between the n type base region 10 and the second electrode 12 in the Z axis direction. A length of the gate electrode 13 in the Z axis direction is shorter than that of the first connection region 51 in the Z axis direction and that of the second connection region 52 in the Z axis direction. The gate electrode 13 has a predetermined length in the Z axis direction. The gate electrode 13 extends in the X axis direction. The length of the gate electrode 13 in the Z axis direction is 1 μm to 4 μm for example. A distance between the center of the gate electrode 13 and the center of the first connection region 51 in the Y axis direction is 1 μm to 6 μm, for example. A distance between the center of the gate electrode 13 and the center of the second connection region 52 in the Y axis direction 1 μm to 6 μm, for example.

The p type base region 20 is provided between the n type base region 10 and the second electrode 12 in the Z axis direction. The p type base region 20 is provided between the first connection region 51 and the gate electrode 13 in the Y axis direction. The p type base region 20 is electrically connected to the second electrode 12. The p type base region 20 is electrically connected to the n type base region 10. The p type base region 20 abuts the n type base region 10 and the second electrode 12.

The p type base region 20 varies in length in the Z axis direction. The p type base region 20 extends in the X axis direction. The p type base region 20 includes a region 20a and a region 20b. The p type base region 20 in the Z direction in the region 20a becomes shorter from the first connection region 51 toward the gate electrode 13. A pn junction portion where the p type base region 20 and the n type base region 10 are joined in the semiconductor device 101 is referred to as a junction portion pn1. A distance between the junction portion pn1 and the second electrode 12 in the Z axis direction in the region 20b is longer than the length of the gate electrode 13 in the Z axis direction. The region 20b in the Z axis direction is longer than that of the region 20a in the Z axis direction.

The p type base region 30 is provided between the n type base region 10 and the second electrode 12 in the Z axis direction. The p type base region 30 is provided between the second connection region 52 and the gate electrode 13 in the Y axis direction. The p type base region 30 is electrically connected to the second electrode 12. The p type base region 30 is electrically connected to the n type base region 10. The p type base region 30 abuts the second electrode 12 and the n type base region 10.

The p type base region 30 varies in length in the Z axis direction. The p type base region 30 extends in the X axis direction. The p type base region 30 includes a region 30a and a region 30b. The p type base region 30 in the Z axis direction in the region 30a becomes shorter from the second connection region 52 toward the gate electrode 13. A pn junction portion where the p type base region 30 and the n type base region 10 are joined in the semiconductor device 101 is referred to as a junction portion pn2. A distance between the junction portion pn2 and the second electrode 12 in the Z axis direction in the region 30b is longer than the gate electrode 13 in the Z axis direction. The region 30b in the Z axis direction is longer than that of the region 30a in the Z axis direction.

The n⁺ type emitter region 40 is provided between the p type base region 20 and the second electrode 12 in the Z axis direction. The n⁺ type emitter region 40 is electrically connected to the second electrode 12 and the p type base region 20. The n⁺ type emitter region 40 abuts the second electrode 12 and the p type base region 20. The n⁺ type emitter region 40 has a predetermined length in the Z axis direction. The n⁺ type emitter region 40 extends in the X axis direction.

The n⁺ type emitter region 50 is provided between the p type base region 30 and the second electrode 12 in the Z axis direction. The n⁺ type emitter region 50 is electrically connected to the second electrode 12 and the p type base region 30. The n⁺ type emitter region 50 abuts the second electrode 12 and the p type base region 30. The n⁺ type emitter region 50 has a predetermined length in the Z axis direction. The n⁺ type emitter region 50 extends in the X axis direction.

The insulating film 61 is provided between the first connection region 51 and the n type base region 10. The insulating film 61 is also provided between the first connection region 51 and the p type base region 20. The insulating film 61 abuts the first connection region 51, the n type base region 10, and the p type base region 20. The insulating film 61 extends in the X axis direction. A thickness of the insulating film 61 is in a range of from 50 to 200 nm for example.

The insulating film 62 is provided between the second connection region 52 and the n type base region 10. The insulating film 62 is also provided between the second connection region 52 and the p type base region 30. The insulating film 62 abuts the second connection region 52, the n type base region 10, and the insulating film 62. The insulating film 62 extends in the X axis direction. A thickness of the insulating film 62 is 50 to 200 nm for example.

The gate insulating film 63 is provided between the gate electrode 13 and the n type base region 10. The gate insulating film 63 is also provided between the gate electrode 13 and the p type base region 20. The gate insulating film 63 is also provided between the gate electrode 13 and the p type base region 30. The gate insulating film 63 is also provided between the gate electrode 13 and the n⁺ type emitter region 40. The gate insulating film 63 is also provided between the gate electrode 13 and the n⁺ type emitter region 50.

The gate insulating film 63 abuts the gate electrode 13, the n type base region 10, the p type base region 20, the p type base region 30, the n⁺ type emitter region 40, and the n⁺ type emitter region 50. The gate insulating film 63 extends in the X axis direction. A thickness of the gate insulating film 63 is in a range of from 50 to 200 nm for example.

The sum of the length of the n⁺ type emitter region 40 and the length of the p type base region 20 alongside the gate insulating film 63 in the Z axis direction is referred to as a first length L1. The length of the p type base region 20 alongside the insulating film 61 in the Z axis direction is referred to as a second length L2. In other words, the first length L1 is the length of the region 20a that abuts the gate insulating film 63 in the Z axis direction. The second length L2 is the length of the region 20b that abuts the insulating film 61 in the Z axis direction. The first length L1 is shorter than the second length L2.

The sum of the length of the n⁺ type emitter region 50 and the length of the p type base region 30 alongside the gate insulating film 63 in the Z axis direction is referred to as a third length L3. The length of the p type base region 30 alongside the insulating film 62 in the Z axis direction is referred to as a length L4. In other words, the third length L3 is the length of the region 30a that abuts the gate insulating film 63 in the Z axis direction. The fourth length L4 is the length of the region 30b that abuts the insulating film 62 in the Z axis direction. The third length L3 is shorter than the fourth length L4.

FIGS. 2A to 3C are cross-sectional views illustrating steps of a manufacturing process of the semiconductor device according to the first embodiment.

Figure 2A:
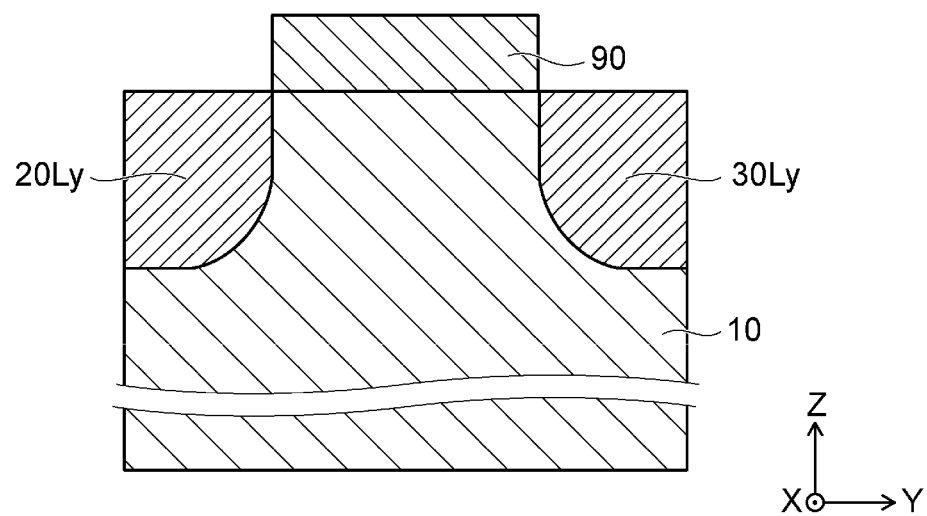
FIGS. 2A to 2C are cross-sectional views illustrating steps of the manufacturing process of the semiconductor device according to the first embodiment.

As illustrated in FIG. 2A, a mask 90 is formed on the n type base region 10. The p type impurities are injected into the n type base region 10 which is exposed through the mask 90. Therefore, a p type semiconductor region 20Ly and a p type semiconductor region 30Ly are selectively formed in the surface of the n type base region 10.

Figure 2B:
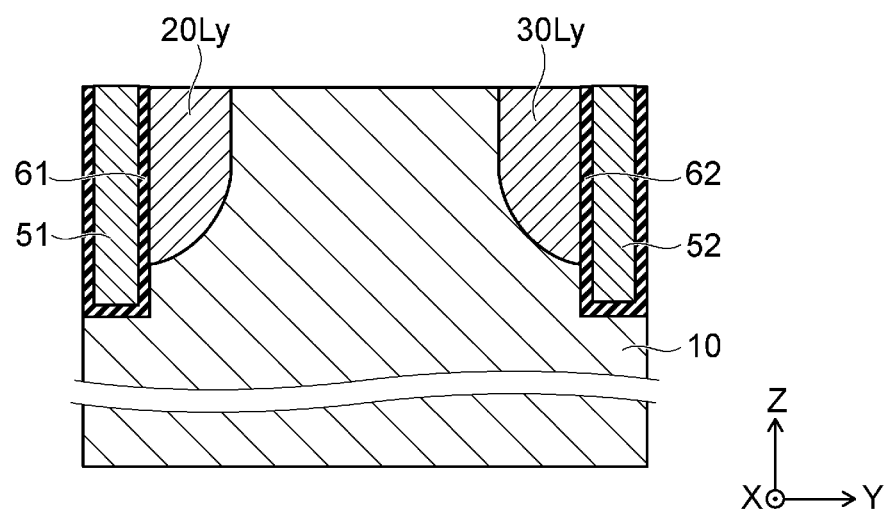

As illustrated in FIG. 2B, the first connection region 51 and the insulating film 61 are formed through the p type semiconductor region 20Ly from the surface of the n type base region 10. The second connection region 52 and the insulating film 62 are formed through the p type semiconductor region 30Ly from the surface of then type base region 10. Photolithography, dry etching, sputtering, CVD, and the like may be used in a process of forming the first connection region 51, the insulating film 61, the second connection region 52, and the insulating film 62.

Figure 2C:
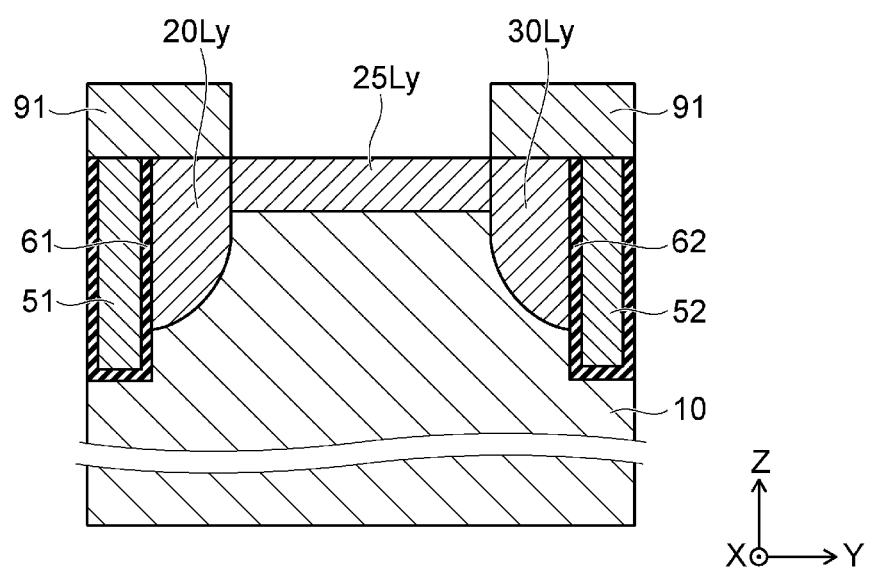

As illustrated in FIG. 2C, a mask 91 is formed on the first connection region 51, the insulating film 61, and the p type semiconductor region 20Ly. The mask 91 is also formed on the second connection region 52, the insulating film 62, and the p type semiconductor region 30Ly.

The p type impurities are injected into the n type base region 10 which is exposed through the mask 91. Therefore, a p type semiconductor region 25Ly is formed in the surface of the n type base region 10. Alternatively, the p type impurities may be injected to the p type semiconductor region 20Ly and the p type semiconductor region 30Ly in an overlapping manner without using the mask 91.

Figure 3A:
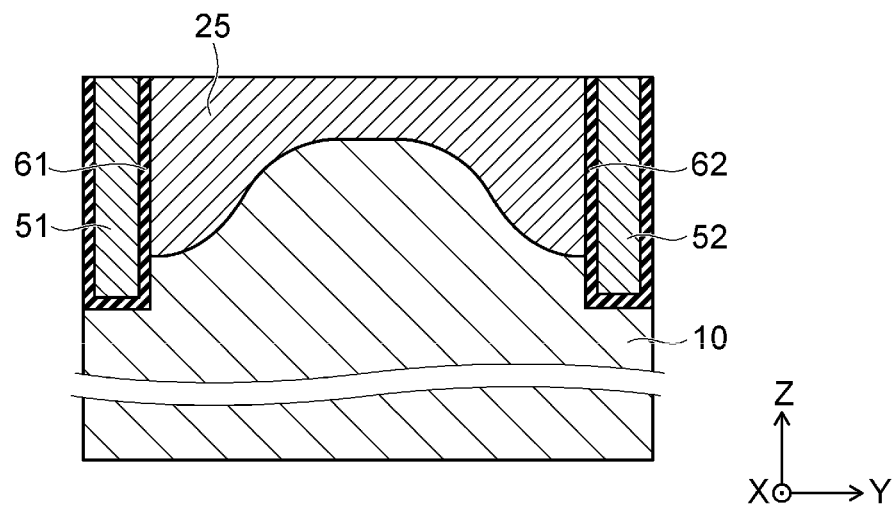
FIGS. 3A to 3C are cross-sectional views illustrating additional steps of the manufacturing process of the semiconductor device according to the first embodiment.

The p type semiconductor region 20Ly, the p type semiconductor region 30Ly, and the p type semiconductor region 25Ly are heated to form the structure illustrated in FIG. 3A. Therefore, the p type semiconductor region 20Ly, the p type semiconductor region 30Ly, and the p type semiconductor region 25Ly are integrally formed as a p type semiconductor region 25 between the first connection region 51 and the second connection region 52. The length of the center portion in the Z axis direction in the p type semiconductor region 25 is thinner than the end portions because the p type impurities are injected deeper when forming the p type semiconductor regions 20Ly and 30Ly than when forming the p type semiconductor region 25Ly.

Figure 3B:
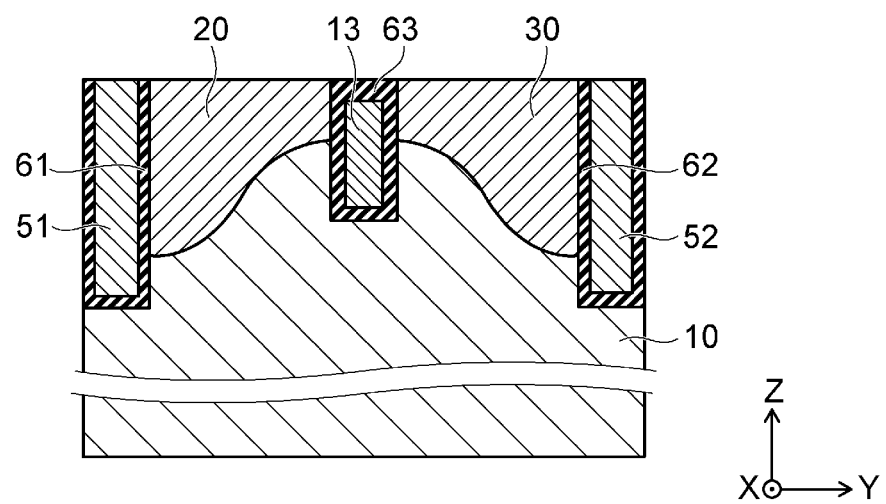

As illustrated in FIG. 3B, the gate insulating film 63 and the gate electrode 13 are formed through the p type semiconductor region 25 and into the n type base region 10. The p type semiconductor region 25 is divided by the gate insulating film 63 and the gate electrode 13 to form the p type base region 20 between the first connection region 51 and the gate electrode 13, and the p type base region 30 between the second connection region 52 and the gate electrode 13.

Figure 3C:
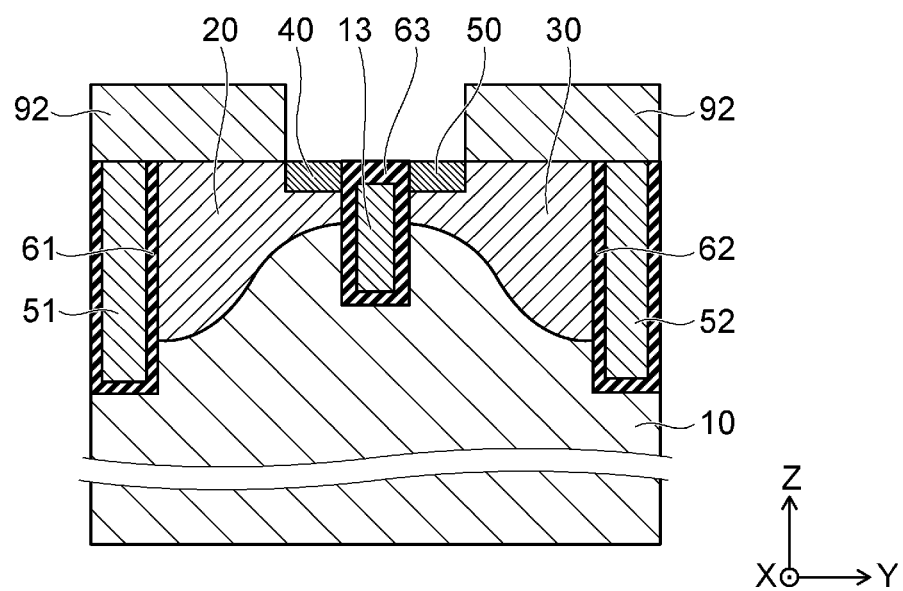

As illustrated in FIG. 3C, a mask 92 is formed on the first connection region 51, the insulating film 61, and the p type semiconductor region 20. The mask 92 is also formed on the second connection region 52, the insulating film 62, and the p type semiconductor region 30. The mask 92 is formed such that a portion of the p type base region 20 and a portion of the p type base region 30 are exposed.

The n type impurities are injected into the p type base region 20 which is exposed through the mask 92. Therefore, the n+ type emitter region 40 is formed in the surface of the p type base region 20, and the n+ type emitter region 50 is formed in the surface of the p type base region 30. Thereafter, the p type impurities are injected into the n type base region 10 to form the p+ collector region 60 illustrated FIG. 1A.

The description will be made about an operation of the semiconductor device 101.

Figure 4:
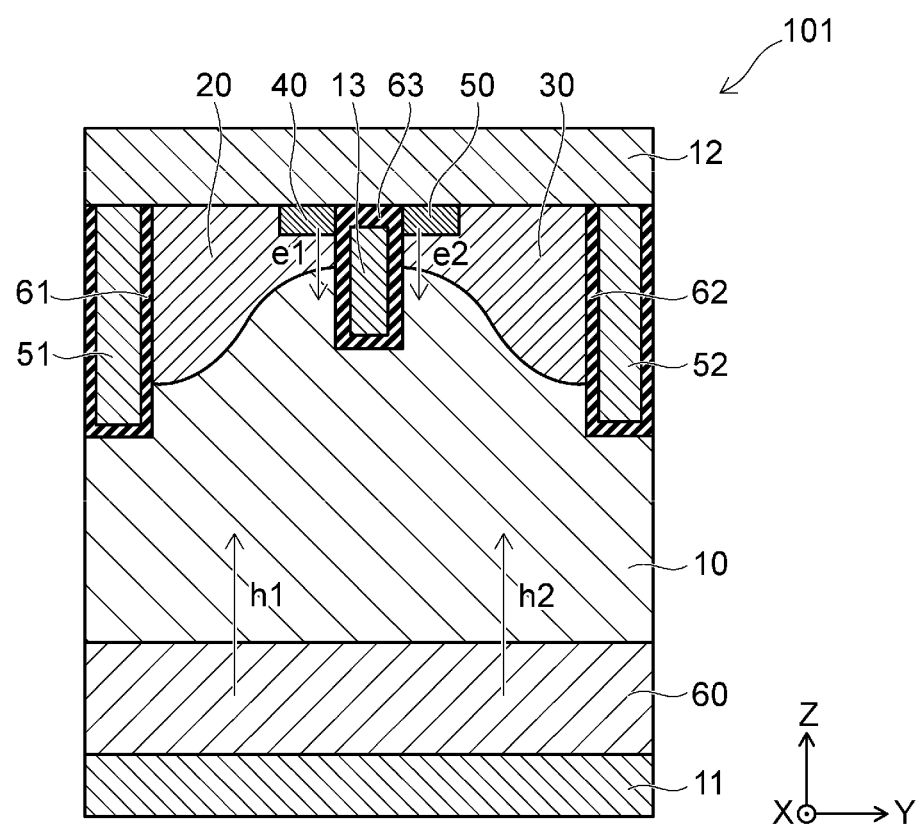
FIG. 4 is a cross-sectional view illustrating an operation of the semiconductor device according to the first embodiment.
Figure 5A:
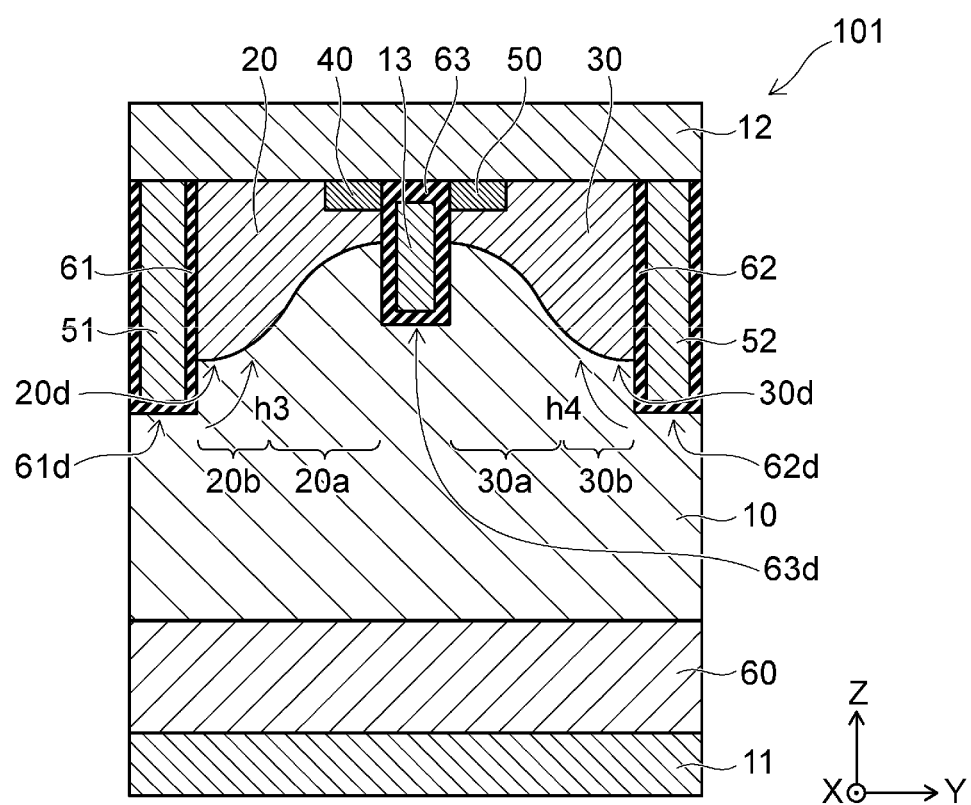
FIGS. 5A and 5B are cross-sectional views illustrating an operation of the semiconductor device according to the first embodiment.
Figure 5B:
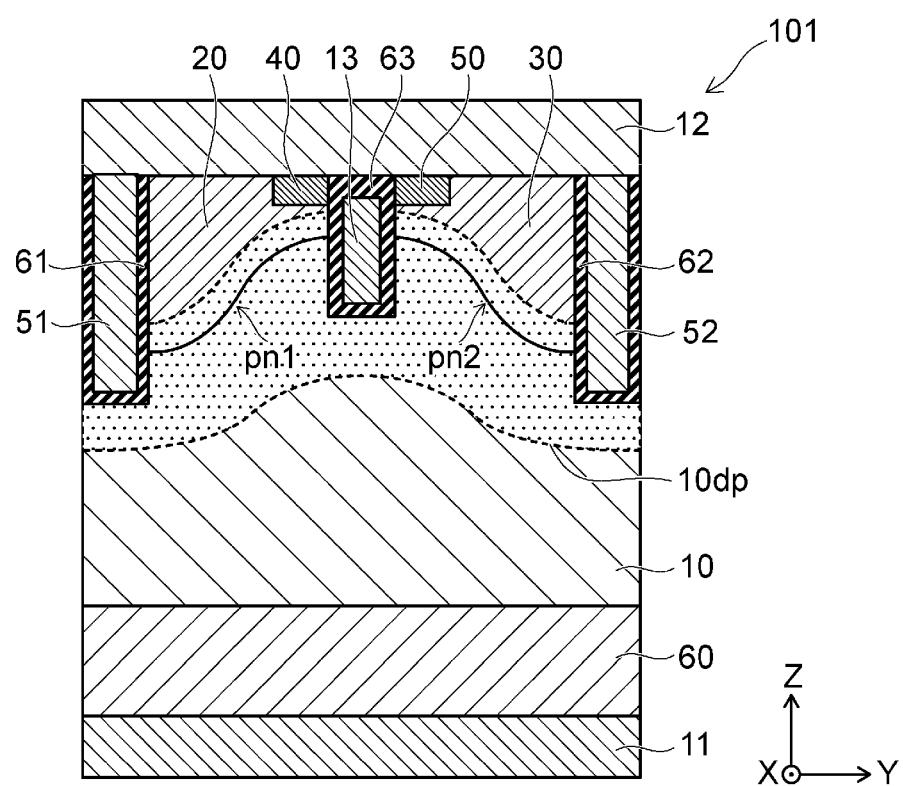

FIGS. 4, 5A, and 5B are cross-sectional views illustrating the operation of the semiconductor device according to the first embodiment.

FIG. 4 illustrates a state after the semiconductor device 101 is turned on. In this embodiment, the state of "turned on" is also referred to as an ON state.

In the ON state, a potential higher than that of the second electrode 12 is applied to the first electrode 11. A potential equal to or higher than a threshold potential (Vth) is applied to the gate electrode 13. Therefore, a channel region is formed in the p type base regions 20 and 30 along the gate insulating film 63.

An electron current e1 flows to the n type base region 10 via a channel from the n+ type emitter region 40. An electron current e2 flows to the n type base region 10 via a channel from the n+ type emitter region 50.

The electron current e1 injected from the n+ type emitter region 40 reaches the p+ type collector region 60 below the n+ type emitter region 40. The electron current e2 injected from the n+ type emitter region 50 reaches the p+ type collector region 60 below the n+ type emitter region 50.

On the other hand, holes are injected from the p+ type collector region 60. In FIG. 4, the hole injection is illustrated as hole currents h1 and h2.

The hole current h1 flows to the second electrode 12 via the n type base region 10 and the p type base region 20. The hole current h2 flows to the second electrode 12 via the n type base region 10 and the p type base region 30.

In the semiconductor device 101, the length L1 of the p type base region 20 is smaller than the length L2 of the p type base region 20. In addition, the length L3 of the p type base region 30 is smaller than the length L4 of the p type base region 20. In other words, the length of the channel region in the Z axis direction is made shorter in the semiconductor device 101 than in the prior art.

Since the channel is made shorter, the electron injection from the n+ type emitter regions 40 and 50 is promoted. Therefore, the ON-state resistance is lowered in the semiconductor device 101.

In addition, since the channel is made shorter, a parasitic capacitance Cge between the gate electrode 13 and the second electrode 12 and a parasitic capacitance Cgc between the gate electrode 13 and the first electrode 11 are reduced in the ON state. Therefore, a faster switching operation of the semiconductor device 101 is achieved.

In addition, in the semiconductor device 101, a distance between the first connection region 51 and the second connection region 52 in the Y axis direction may be varied. When the distance between the first connection region 51 and the second connection region 52 is made narrower, the holes are more easily retained in the n type base region 10 between the first connection region 51 and the second connection region 52 in accordance with the increase in the IE effect. Therefore, the ON-state resistance is reduced in the semiconductor device 101.

In addition, when the distance between the first connection region 51 and the second connection region 52 is made narrower, a miniaturization of the IGBT is achieved in that the number of the gate electrodes 13 per unit area is increased. Moreover, because the parasitic capacitance Cge and the parasitic capacitance Cgc of the gate electrode 13 are initially lowered in the semiconductor device 101, even when the miniaturization is progressed, switching speed is hardly affected in the semiconductor device 101.

FIG. 5A illustrates a state after the semiconductor device 101 is turned off. In this embodiment, the state of "turned off" is also referred to as an OFF state. FIG. 5B illustrates a depletion layer 10dp in the n type base region 10 after the semiconductor device 101 is turned off.

In a case where a potential smaller than the threshold potential (Vth) is applied to the gate electrode 13 although a potential higher than that of the second electrode 12 is applied to the first electrode 11, the channel region disappears to block the electron injection from the n+ type emitter regions 40 and 50. On the other hand, the holes left in the n type base region 10 flow to the second electrode 12 via the p type base regions 20 and 30.

After the semiconductor device 101 is turned off, the depletion layer extends from the junction portion pn1 into the p type base region 20 and the n type base region 10. In addition, after turning off, the depletion layer extends from the junction portion pn2 into the p type base region 30 and the n type base region 10. The depletion layer extends into the n type base region 10 also from an interface between the insulating film 61 and the n type base region 10, an interface between the insulating film 62 and the n type base region 10, and an interface between the gate insulating film 63 and the n type base region 10. These depletion layers are connected in the n type base region 10. The connected depletion layer 10dp is widened below the insulating film 61, the insulating film 62, and the gate insulating film 63. Therefore, the breakdown voltage becomes higher.

In addition, an electric field is easily concentrated at a lower end 62d of the insulating film 62 or a lower end 61d of the insulating film 61 compared to a lower end 63d of the gate insulating film 63 in the semiconductor device 101. Therefore, an avalanche current easily flows in the vicinity of the lower end 62d of the insulating film 62 or in the vicinity of the lower end 61d of the insulating film 61.

Herein, the p type base region 20 includes the region 20b. The region 20b abuts the insulating film 61, and is closest to the first electrode 11 in the p type base region 20. The region 20b is a p type region of which the resistance is lowered by the holes. Therefore, an avalanche current (for example, a hole current h3) generated in the vicinity of the lower end 61d of the insulating film 61 flows to the second electrode 12 via the region 20b.

On the other hand, the p type base region 30 includes the region 30b. The region 30b abuts the insulating film 62, and is closest to the first electrode 11 in the p type base region 30. The region 30b is a p type region of which the resistance is lowered by the holes. Therefore, an avalanches current (for example, a hole current h4) generated in the vicinity of the lower end 62d of the insulating film 62 flows to the second electrode 12 via the region 30b. Therefore, a sufficient breakdown voltage can be achieved in the OFF state in the semiconductor device 101, and in addition, breakdown resistance during switching to the OFF state is improved.

In addition, the region 20b and the region 30b are separated from the n+ type emitter region 40 in the Y axis direction.

Therefore, the hole current h3 flowing into the region 20b and the region 30b easily flows to the second electrode 12 before reaching the n+ type emitter region 40.

On the contrary, in a case where the hole current h3 reaches the n+ type emitter regions 40 and 50, a parasitic npn transistor may be operated as an element. The parasitic npn transistor is, for example, the n+ type region 40/the p type region 20/the n type region 10, or the n+ type region 50/the p type region 30/the n type region 10. When the parasitic npn transistor is operated, a phenomenon known as latch-up occurs. When latch-up occurs, gate driving is not possible, and the IGBT may be broken.

In the semiconductor device 101, the region 20b and the region 30b are separated from the n+ type emitter region 40 in the Y axis direction. Therefore, the hole current reaching the region 20b and the region 30b is unlikely to reach the n+ type emitter regions 40 and 50, and latch-up is unlikely to occur.

In addition, when the length of the channel region is made shorter, the resistance of the p type base region in the vicinity of the channel region is increased, and the holes may easily remain in the p type base region in the vicinity of the channel region. In this case, an energy barrier between the n+ type emitter region and the p type base region is lowered, and the parasitic npn transistor may be formed.

On the contrary, in the semiconductor device 101, the hole currents h3 and h4 easily flow to the second electrode 12 via the regions 20b and 30b even when the length of the channel region is made shorter. Therefore, the holes are unlikely to remain in the p type base regions 20 and 30 in the vicinity of the channel region, and the parasitic npn transistor is unlikely to be formed. As a result, with this configuration, latch-up is unlikely to occur.

In addition, the lower end 61d of the insulating film 61 and the lower end 62d of the insulating film 62 are positioned on a side nearer the first electrode 11 compared to the lower end 63d of the gate insulating film 63. Therefore, the avalanche current easily flows in the n type base region 10 near the lower end 61d of the insulating film 61 and the lower end 62d of the insulating film 62, below the p type base regions 20 and 30 and the n+ type emitter regions 40 and 50.

Therefore, an increase in temperature caused by the avalanche current is observed in the regions 20b and 30b and in the n type base region 10. The increase in temperature in the p type base regions 20a and 30a and in the n+ type emitter regions 40 and 50 is suppressed. Therefore, latch-up is less likely to occur.

After the semiconductor device 101 is turned off, the depletion layer extends from the junction portion pn1 into the p type base region 20 and the n type base region 10. In addition, after the semiconductor device 101 is turned off, the depletion layer extends from the junction portion pn2 into the p type base region 30 and the n type base region 10. The depletion layer extends into the n type base region 10 also from an interface between the insulating film 61 and the n type base region 10, an interface between the insulating film 62 and the n type base region 10, and an interface between the gate insulating film 63 and the n type base region 10.

These depletion layers are connected in the n type base region 10. The connected depletion layer 10dp is widened below the insulating film 61, the insulating film 62, and the gate insulating film 63.

When the depletion layer 10dp is assumed to function as an insulating layer, the total length of the insulating layer between the gate electrode 13 and the n type base region 10 becomes the sum of the length of the gate insulating film 63 in the Z axis direction and the length of the depletion layer 10dp in the Z axis direction.

Therefore, the length of the insulating layer between the gate electrode 13 and the n type base region 10 becomes longer, and the parasitic capacitance Cgc between the gate electrode 13 and the first electrode 11 is lowered. Therefore, the switching operation is performed at a higher speed in the semiconductor device 101.

On the other hand, after the semiconductor device 101 is turned off, the n type base region 10 between the first connection region 51 and the second connection region 52 is blocked by the depletion layer 10dp. Therefore, a leakage current between the first electrode 11 and the second electrode 12 after turning off is suppressed.

Second Embodiment

Figure 6A:
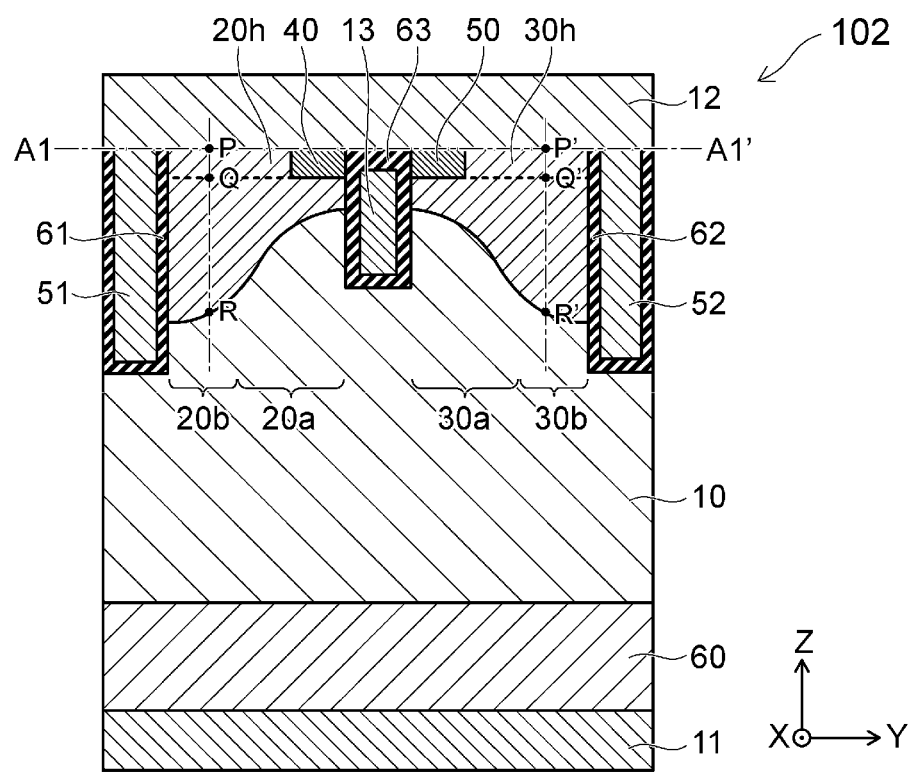
FIGS. 6A to 6C are diagrams illustrating a semiconductor device according to a second embodiment.
Figure 6B:
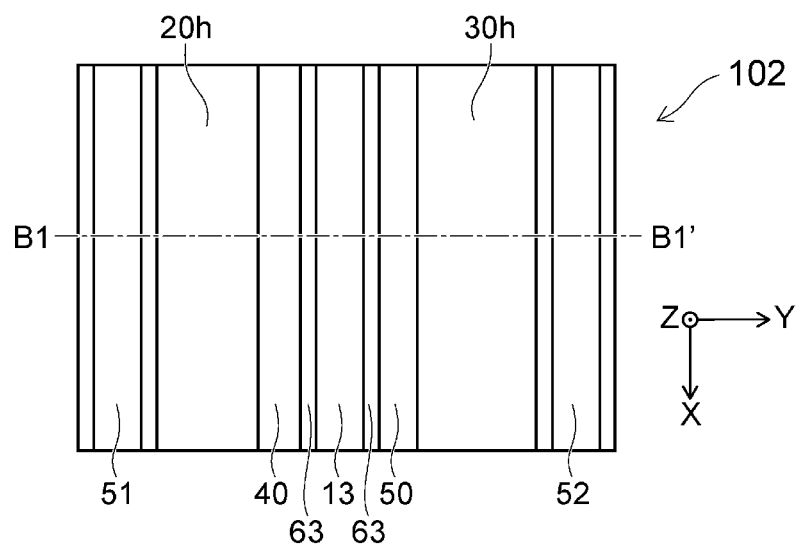
Figure 6C:
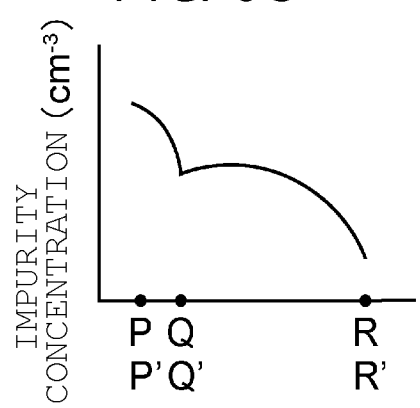

FIGS. 6A to 6C are diagrams illustrating a semiconductor device according to a second embodiment. FIG. 6A illustrates a cross-sectional view taken along a line B1-B1' in FIG. 6B. FIG. 6B illustrates a cross-sectional view taken along a line A1-A1' in FIG. 6A. FIG. 6C illustrates a profile of a p type impurity concentration at points P to R and points P' to R' in FIG. 6A.

The p type base region 20 in a semiconductor device 102 according to the second embodiment includes a region 20h of which the p type impurity concentration is relatively high. The p type base region 30 includes a region 30h of which the p type impurity concentration is relatively high. In each of the regions 20h and 30h, the impurity concentration is increased in the Z direction from a side of the first electrode 11 toward a side of the second electrode 12. Each of the regions 20h and 30h has a low resistance due to holes.

The region 20h is overlapped with the region 20b in the Z axis direction. The region 30h is overlapped with the region 30b in the Z axis direction. The region 20h is provided between the n+ type emitter region 40 and the first connection region 51 in the Y axis direction. The region 30h is provided between the n+ type emitter region 50 and the second connection region 52 in the Y axis direction. In alternative embodiments, one of the region 20h and the region 30h may be removed.

With the presence of the region 20h, the holes flowing into the p type base region 20 after turning off easily flow to the second electrode 12 via the region 20h. With the presence of the region 30h, the holes flowing into the p type base region 30 easily flow to the second electrode 12 via the region 30h. Therefore, latch-up after turning off is more suppressed in the semiconductor device 102. The turning-off operation with a large amount of current can be made in the semiconductor device 102 so that latch-up is even more suppressed.

Third Embodiment

Figure 7A:
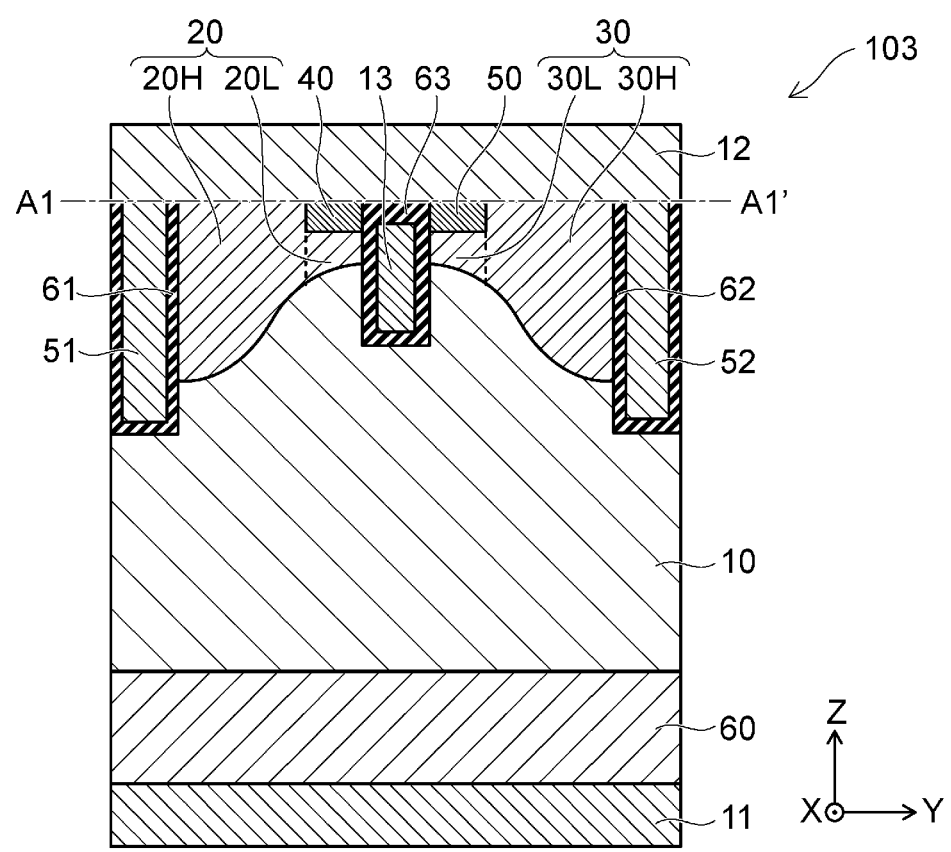
FIGS. 7A and 7B are diagrams illustrating a semiconductor device according to a third embodiment.
Figure 7B:
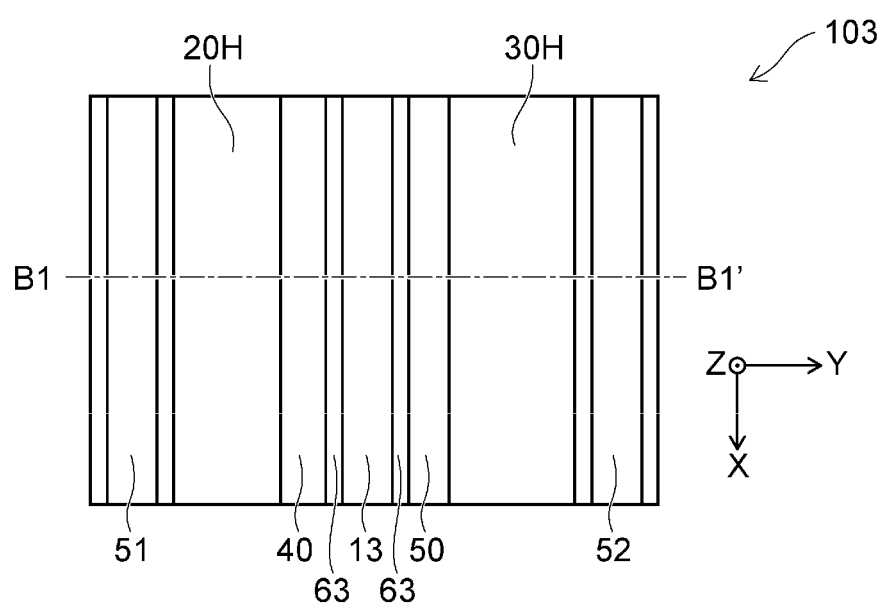

FIGS. 7A and 7B are diagrams illustrating a semiconductor device according to a third embodiment. FIG. 7A illustrates a cross-sectional view taken along a line B1-B1' in FIG. 7B. FIG. 7B illustrates a cross-sectional view taken along a line A1-A1' in FIG. 7A.

In a semiconductor device 103 according to the third embodiment, the impurity concentration of the p type base region 20 provided between the n+ type emitter region 40 and the n type base region 10 in the Z axis direction is lowered. For example, the p type base region 20 includes a portion 20H and a portion 20L. The portion 20H is aligned with the portion 20L in the Y axis direction. In the case of this embodiment, the portion 20H is a p+ type semiconductor region, and the portion 20L is a p type semiconductor region. The portion 20L is provided between the n+ type emitter region 40 and the n type base region 10 in the Z axis direction.

In addition, the impurity concentration of the p type base region 30 provided between the n+ type emitter region 50 and the n type base region 10 in the Z axis direction is lowered. For example, the p type base region 30 includes a portion 30H and a portion 30L. The portion 30H is aligned with the portion 30L in the Y axis direction. The portion 30H is a p+ type semiconductor region, and the portion 30L is a p type semiconductor region. The portion 30L is provided between the n+ type emitter region 50 and the n type base region 10 in the Z axis direction.

With the presence of the portion 20H, the holes flowing into the p type base region 20 after turning off easily flow to the second electrode 12 via the portion 20H. With the presence of the portion 30H, the holes flowing into the p type base region 30 easily flow to the second electrode 12 via the portion 30H. Therefore, latch-up after turning off is more suppressed. The turning-off operation with a large amount of current can be made in the semiconductor device 103 so that latch-up is even more suppressed.

Fourth Embodiment

Figure 8A:
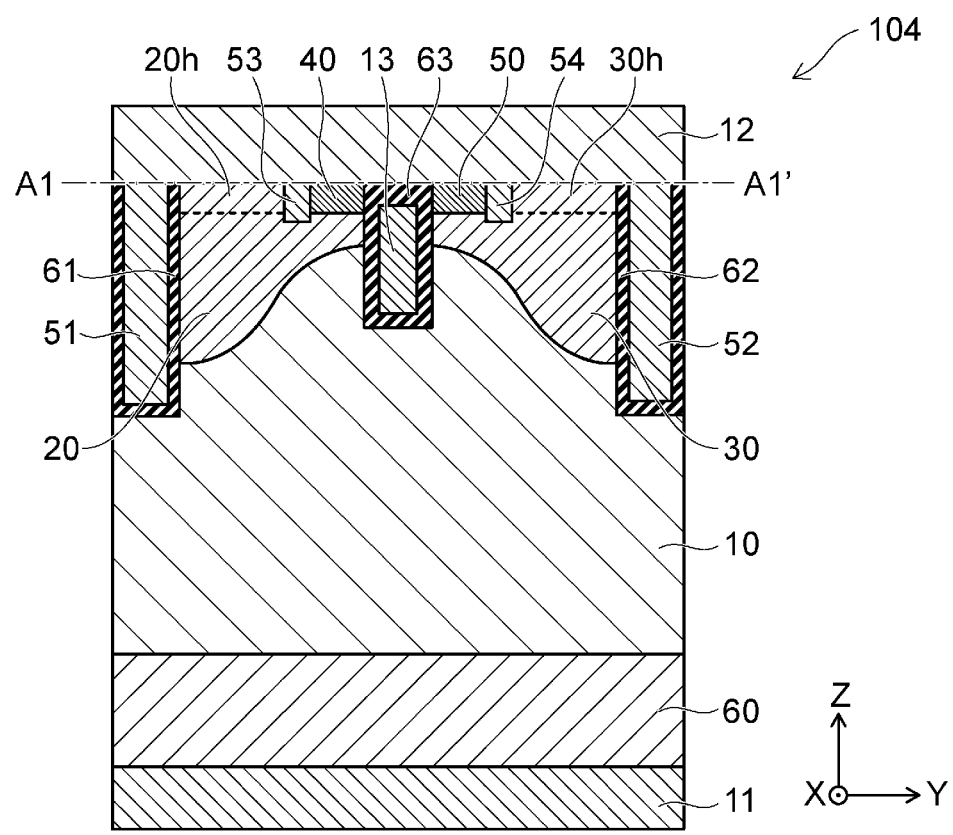
FIGS. 8A and 8B are diagrams illustrating a semiconductor device according to a fourth embodiment.
Figure 8B:
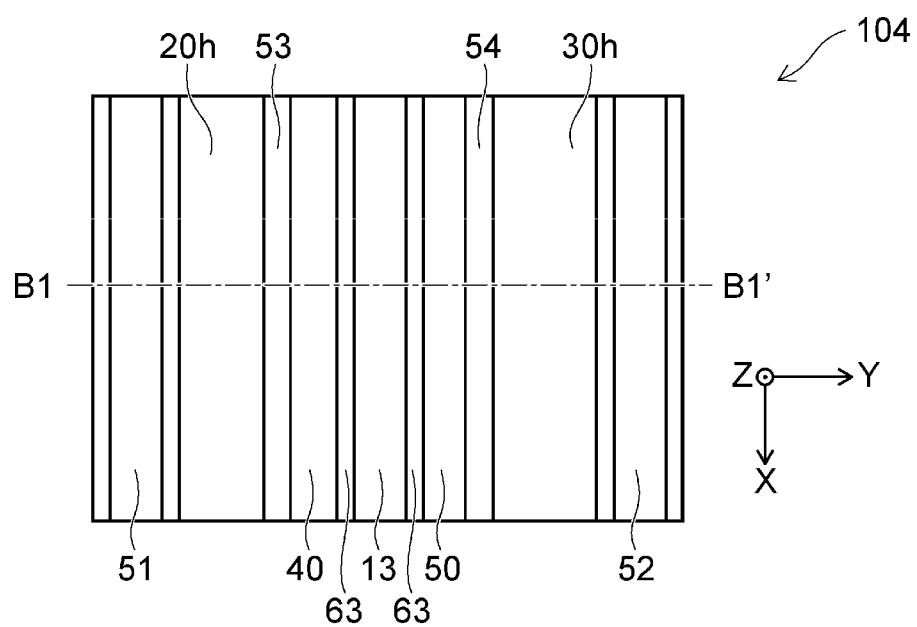

FIGS. 8A and 8B are diagrams illustrating a semiconductor device according to a fourth embodiment. FIG. 8A illustrates a cross-sectional view taken along a line B1-B1' in FIG. 8B. FIG. 8B illustrates a cross-sectional view taken along a line A1-A1' in FIG. 8A.

A semiconductor device 104 according to the fourth embodiment is further provided with a third connection region 53 and a fourth connection region 54. The material of the third connection region 53 and the fourth connection region 54 is a conductive material. In alternative embodiments, only one of the region 20h and the region 30h is provided.

The third connection region 53 is provided between the p type base region 20 and the second electrode 12 in the Z axis direction. The third connection region 53 is electrically connected to the second electrode 12 and the p type base region 20. The third connection region 53 has a predetermined length in the Z axis direction. The third connection region 53 extends in the X axis direction. The n+ type emitter region 40 is provided between the third connection region 53 and the gate electrode 13 in the Y axis direction.

The fourth connection region 54 is provided between the p type base region 30 and the second electrode 12 in the Z axis direction. The fourth connection region 54 is electrically connected to the second electrode 12 and the p type base region 30. The fourth connection region 54 has a predetermined length in the Z axis direction. The fourth connection region 54 extends in the X axis direction. The n+ type emitter region 50 is provided between the fourth connection region 54 and the gate electrode 13 in the Y axis direction.

In the semiconductor device 104, the width of the n+ type emitter region 40 in the Y axis direction is set by a distance between the third connection region 53 and the gate insulating film 63 in the Y axis direction. When the distance between the third connection region 53 and the gate insulating film 63 in the Y axis direction is made narrow, the width of the n+ type emitter region 40 in the Y axis direction can be made fine. In addition, when the distance between the fourth connection region 54 and the gate insulating film 63 in the Y axis direction is made narrow, the width of the n+ type emitter region 50 in the Y axis direction can be made fine.

In addition, in the semiconductor device 104, the holes flowing into the p type base region 20 after turning off can flow to the second electrode 12 via the third connection region 53. In addition, the holes flowing into the p type base region 30 can flow to the second electrode 12 via the fourth connection region 54. Therefore, latch-up after turning off is more suppressed. The turning-off operation with a large amount of current can be made in the semiconductor device 104 so that latch-up is even more suppressed.

Fifth Embodiment

Figure 9A:
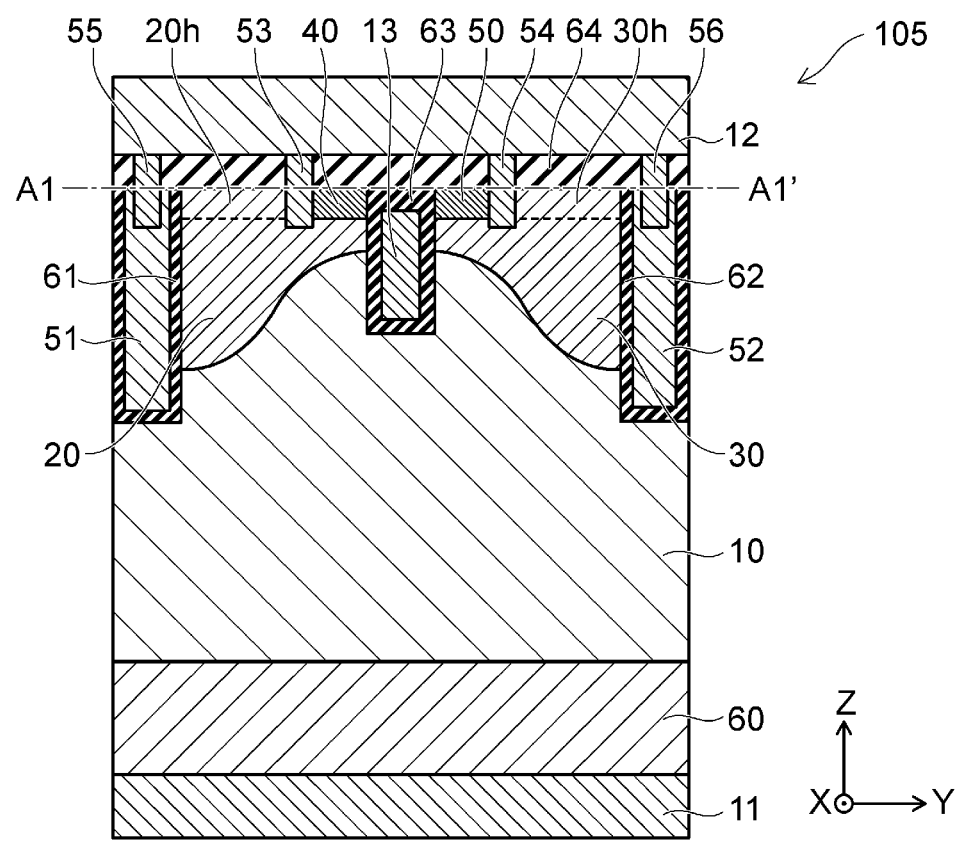
FIGS. 9A and 9B are diagrams illustrating a semiconductor device according to a fifth embodiment.
Figure 9B:
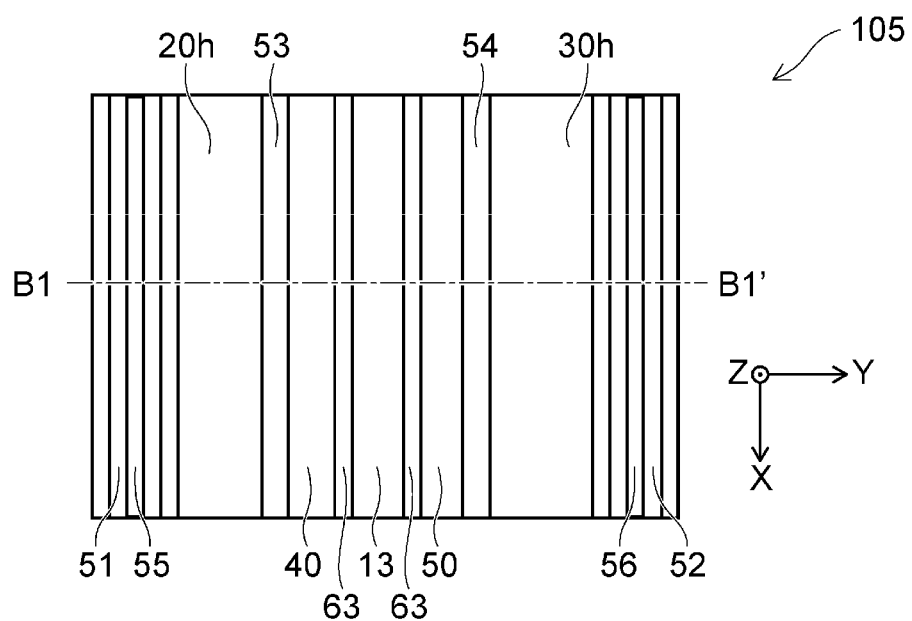

FIGS. 9A and 9B are diagrams illustrating a semiconductor device according to a fifth embodiment. FIG. 9A illustrates a cross-sectional view taken along a line B1-B1' in FIG. 9B. FIG. 9B illustrates a cross-sectional view taken along a line A1-A1' in FIG. 9A.

A semiconductor device 105 according to the fifth embodiment is further provided with a fifth connection region 55, a sixth connection region 56, and a fourth insulating film (e.g., an insulating film 64). The material of the fifth connection region 55 and the fourth connection region 56 is a conductive material.

The fifth connection region 55 electrically connects the first connection region 51 and the second electrode 12. The fifth connection region 55 has a predetermined length in the Z axis direction. The fifth connection region 55 extends in the X axis direction.

The sixth connection region 56 electrically connects the second connection region 52 and the second electrode 12. The sixth connection region 56 has a predetermined length in the Z axis direction. The sixth connection region 56 extends in the X axis direction.

The insulating film 64 is provided between the second electrode 12 and the p type base region 20, between the second electrode 12 and the p type base region 30, between the second electrode 12 and the n+ type emitter region 40, and between the second electrode 12 and the n+ type emitter region 50.

In the semiconductor device 105, the fifth connection region 55 and the sixth connection region 56 are formed during the process of forming the third connection region 53 and the fourth connection region 54. Therefore, in a case where the third connection region 53 and the fourth connection region 54 are formed, a separate manufacturing process of directly connecting the first connection region 51 and the second connection region 52 to the second electrode 12 can be omitted.

Sixth Embodiment

Figure 10A:
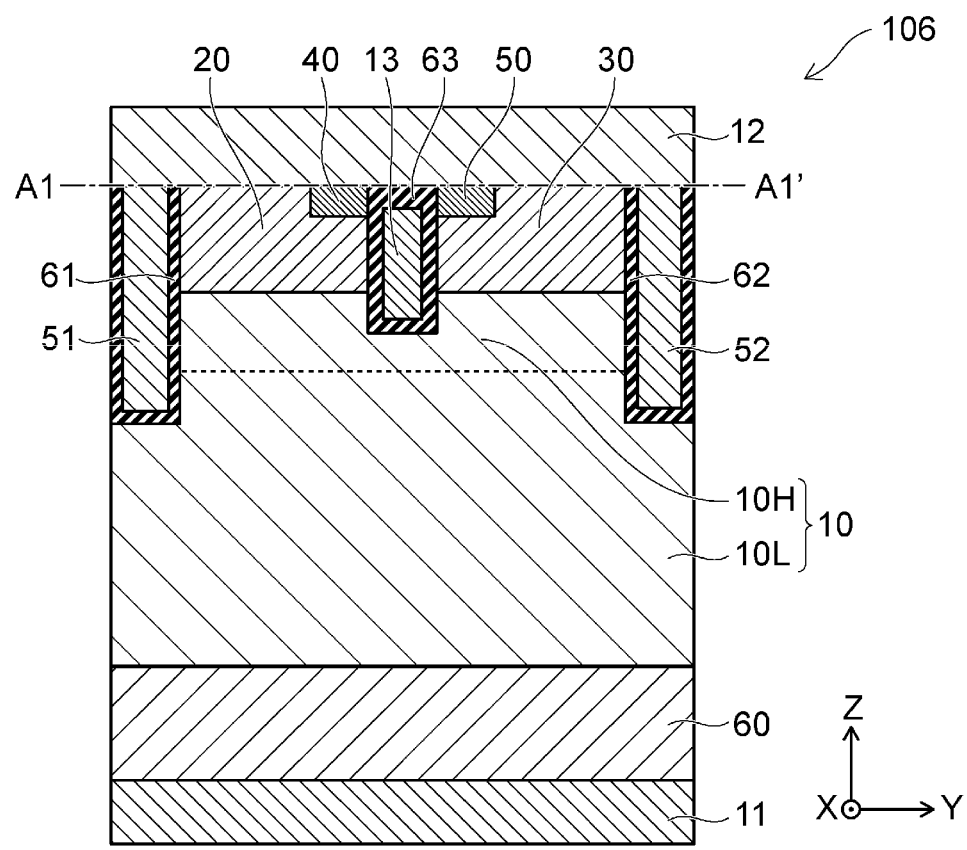
FIGS. 10A and 10B are diagrams illustrating a semiconductor device according to a sixth embodiment.
Figure 10B:
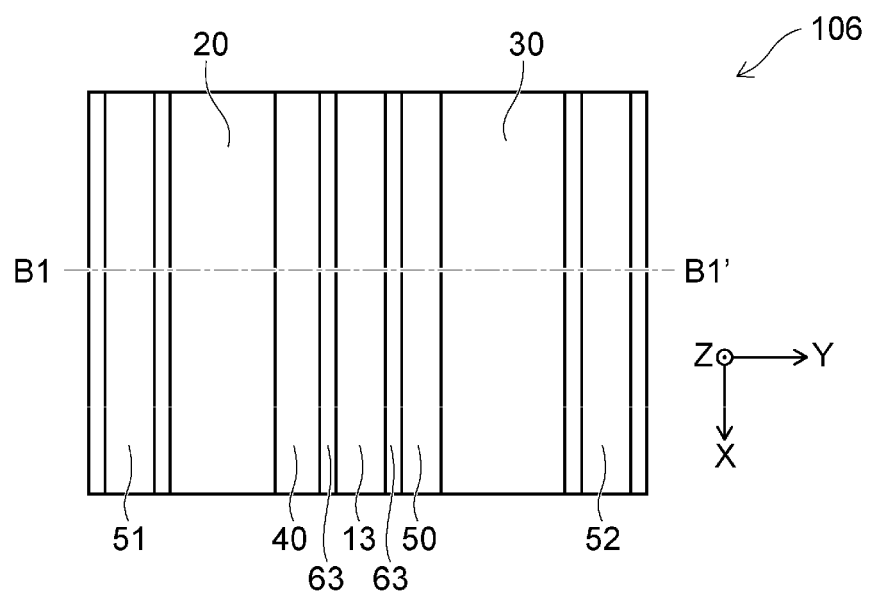

FIGS. 10A and 10B are diagrams illustrating a semiconductor device according to a sixth embodiment. FIG. 10A illustrates a cross-sectional view taken along a line B1-B1' in FIG. 10B. FIG. 10B illustrates a cross-sectional view taken along a line A1-A1' in FIG. 10A.

A semiconductor device 106 according to the sixth embodiment includes the first electrode 11, the second electrode 12, the n type base region 10, the first connection region 51, the second connection region 52, the gate electrode 13, the p type base region 20, the p type base region 30, the n+ type emitter region 40, the n+ type emitter region 50, the insulating film 61, the insulating film 62, the gate insulating film 63, and the p+ type collector region 60.

The n type base region 10 is provided between the first electrode 11 and the second electrode 12. The n type base region 10 includes a first portion 10L and a second portion 10H. The second portion 10H is provided between the first portion 10L and the second electrode 12. The impurity concentration of the second portion 10H is higher than that of the first portion 10L.

The first connection region 51 is provided between the first portion 10L of the n type base region 10 and the second electrode 12. The first connection region 51 is electrically connected to the second electrode 12. The second connection region 52 is provided between the first portion 10L of the n type base region 10 and the second electrode 12. The second connection region 52 is aligned with the first connection region in the Y axis direction. The second connection region 52 is electrically connected to the second electrode 12.

The gate electrode 13 is provided between the second portion 10H of the n type base region 10 and the second electrode 12.

An operation of the semiconductor device 106 will be described.

Figure 11A:
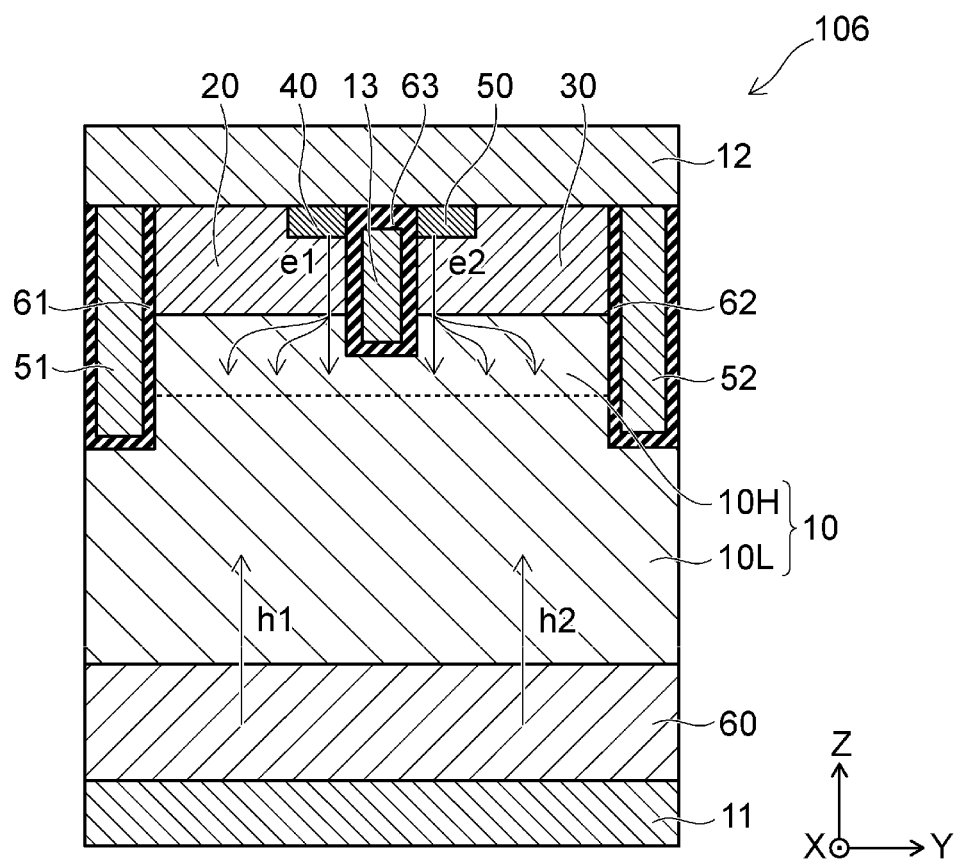
FIGS. 11A and 11B are cross-sectional views illustrating an operation of the semiconductor device according to the sixth embodiment.
Figure 11B:
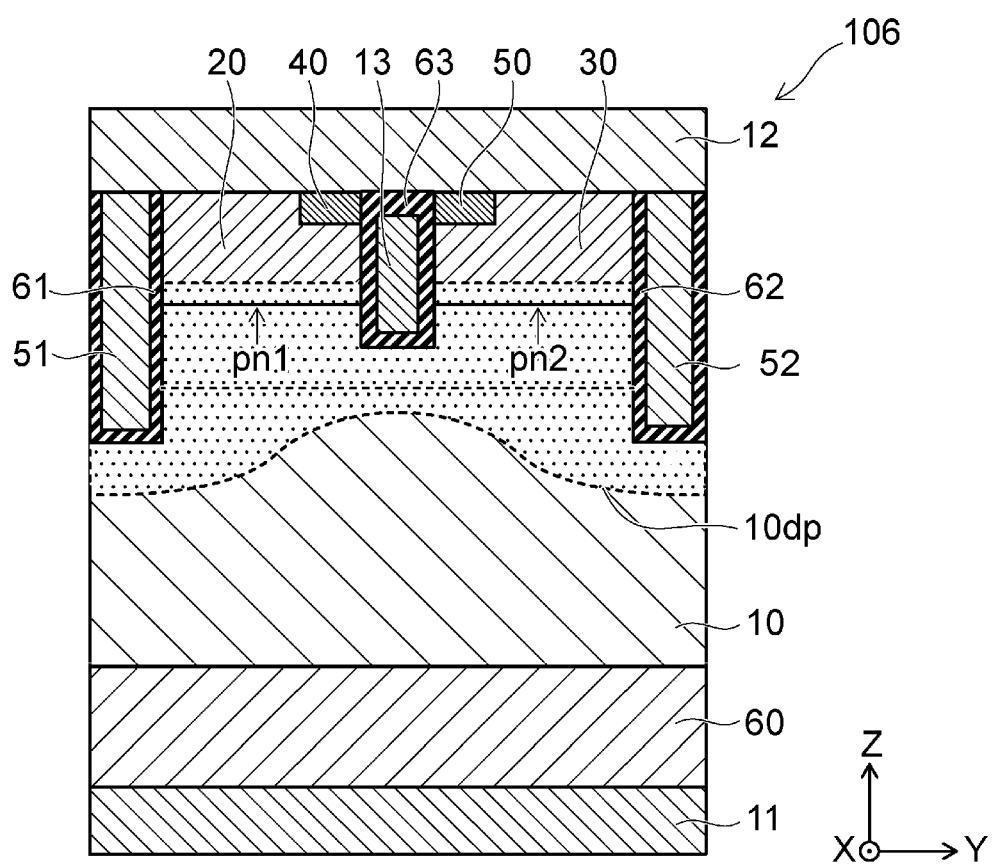

FIGS. 11A and 11B are cross-sectional views illustrating the operation of the semiconductor device according to the sixth embodiment.

FIG. 11A illustrates a state after the semiconductor device 106 is turned on.

When a potential equal to or more than the threshold potential (Vth) is applied to the gate electrode 13, the channel region is formed along the gate insulating film 63.

The electron current e1 flows to the n type base region 10 via the channel from the $n^+$ type emitter region 40. The electron current e2 flows to the n type base region 10 via the channel from the $n^+$ type emitter region 50. The electron current e1 reaches the $p^+$ type collector region 60. The electron current e2 reaches the $p^+$ type collector region 60. On the other hand, the holes h1 and h2 are injected from the $p^+$ type collector region 60.

Herein, the second portion 10H having a high n impurity concentration is provided below the channel region. Therefore, an electron injection enhanced effect (IE effect) is achieved, such that the electron currents e1 and e2 easily flow in the second portion 10H and at the same time the holes injected from the $p^+$ type collector region 60 barely flow from the p type base region 20 and the p type base region 30, and the accumulated carriers are increased. Therefore, the ON-state resistance is further lowered in the semiconductor device 106.

In addition, in the semiconductor device 106, the gate insulating film 63 in the Z axis direction is shorter than the insulating film 61 in the Z axis direction and the insulating film 62 in the Z axis direction.

Therefore, in the ON state, the parasitic capacitance Cge between the gate electrode 13 and the second electrode 12 and the parasitic capacitance Cgc between the gate electrode 13 and the first electrode 11 are reduced. Therefore, the switching operation is performed at a higher speed in the semiconductor device 106.

In addition, the distance between the first connection region 51 and the second connection region 52 in the Y direction can be varied in the semiconductor device 106. When the distance between the first connection region 51 and the second connection region 52 is made narrower, the holes are more easily retained in the n type base region 10 between the first connection region 51 and the second connection region 52 in accordance with the increase in the IE effect. Therefore, the ON-state resistance is reduced in the semiconductor device 106.

A state after the semiconductor device 106 is turned off is illustrated in FIG. 11B.

After turning off, the channel region disappears to block the electron injection from the $n^+$ type emitter regions 40 and 50. On the other hand, the holes left in the n type base region 10 flow to the second electrode 12 via the p type base regions 20 and 30.

In the semiconductor device 106, the lower end 61d of the insulating film 61 and the lower end 62d of the insulating film 62 are positioned on a side nearer the first electrode 11 compared to the lower end 63d of the gate insulating film 63.

Therefore, as described in the first embodiment, a sufficient breakdown voltage can be achieved in the OFF state, and in addition, breakdown resistance during switching to the OFF state is improved.

In the semiconductor device 106, the depletion layer extends from the junction portion pn1 into the p type base region 20 and the n type base region 10 after turning off. In addition, after the semiconductor device 106 is turned off, the depletion layer extends from the junction portion pn2 into the p type base region 30 and the n type base region 10. The depletion layer extends into the n type base region 10 also from an interface between the insulating film 61 and the n type base region 10, an interface between the insulating film 62 and the n type base region 10, and an interface between the gate insulating film 63 and the n type base region 10.

These depletion layers are connected in the n type base region 10. The connected depletion layer 10dp is widened below the insulating film 61, the insulating film 62, and the gate insulating film 63.

When the depletion layer 10dp is assumed to function as an insulating layer, the total length of the insulating layer between the gate electrode 13 and the n type base region 10 becomes the sum of the length of the gate insulating film 63 in the Z axis direction and the length of the depletion layer 10dp in the Z axis direction.

Therefore, the length of the insulating layer between the gate electrode 13 and the n type base region 10 becomes longer, and the parasitic capacitance Cgc between the gate electrode 13 and the first electrode 11 is lowered. Therefore, the switching operation is performed at a higher speed in the semiconductor device 106.

On the other hand, after the semiconductor device 106 is turned off, the n type base region 10 between the first connection region 51 and the second connection region 52 is blocked by the depletion layer 10dp. Therefore, a leakage current between the first electrode 11 and the second electrode 12 after turning off is suppressed.

While being evenly formed in the Y axis direction in this embodiment, the p type base region 20 and the p type base region 30 may be formed to be wider in the Z axis direction on a side nearer the insulating film 61 and the insulating film 62 as in the first embodiment. In such cases, the beneficial effect increases even more.

Seventh Embodiment

Figure 12A:
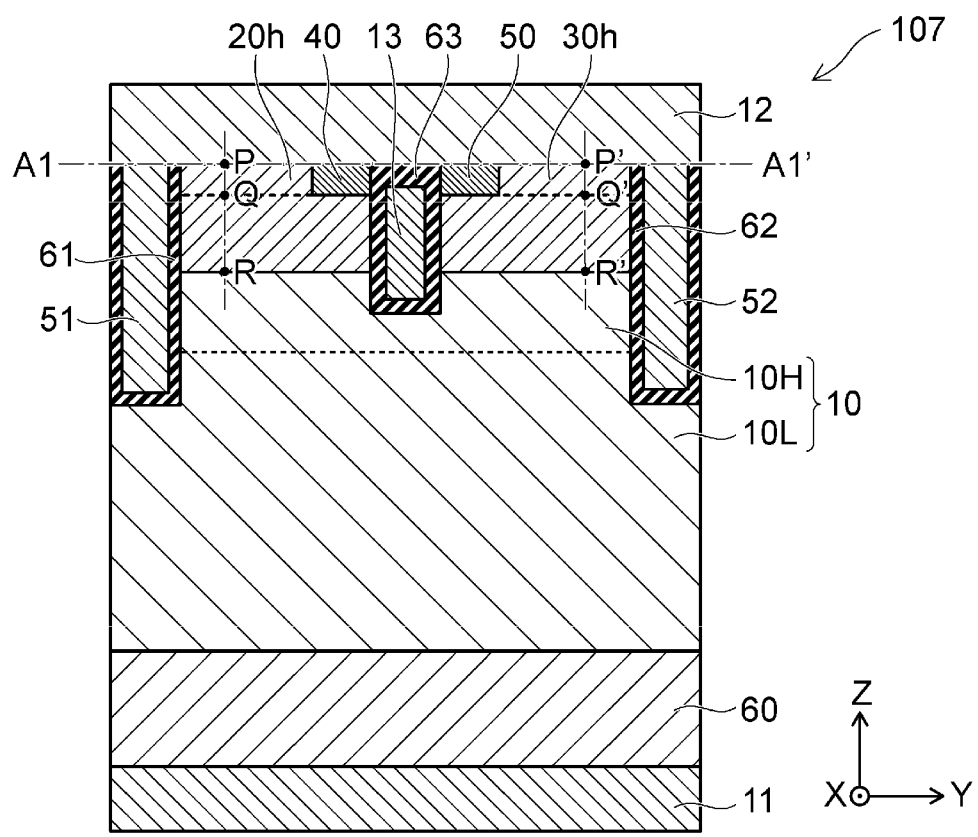
FIGS. 12A to 12C are diagrams illustrating a semiconductor device according to a seventh embodiment.
Figure 12B:
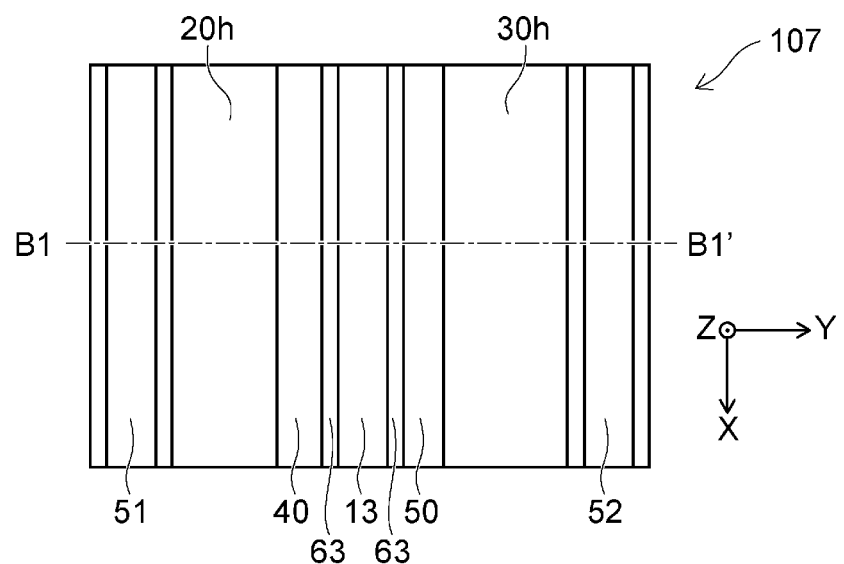
Figure 12C:
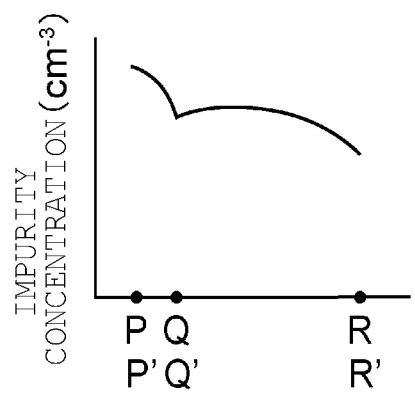

FIGS. 12A to 12C are diagrams illustrating a semiconductor device according to a seventh embodiment. FIG. 12A illustrates a cross-sectional view taken along a line B1-B1' in FIG. 12B. FIG. 12B illustrates a cross-sectional view taken along a line A1-A1' in FIG. 12A. FIG. 12C illustrates a profile of a p type impurity concentration at points P to R and points P' to R' in FIG. 12A.

In a semiconductor device 107 according to the seventh embodiment, the p type base region 20 includes the region 20h of which the p type impurity concentration is relatively high. The p type base region 30 includes a region 30h of which the p type impurity concentration is relatively high. In alternative embodiments, one of the region 20h and the region 30h may be removed.

With the presence of the region 20h, the holes flowing into the p type base region 20 after turning off easily flow to the second electrode 12 via the region 20h. With the presence of the region 30h, the holes flowing into the p type base region 30 easily flow to the second electrode 12 via the region 30h. Therefore, the latch-up after turning off is more suppressed in the semiconductor device 107. The turning-off operation with a large amount of current can be made in the semiconductor device 107 so that latch-up is even more suppressed.

Eighth Embodiment

Figure 13A:
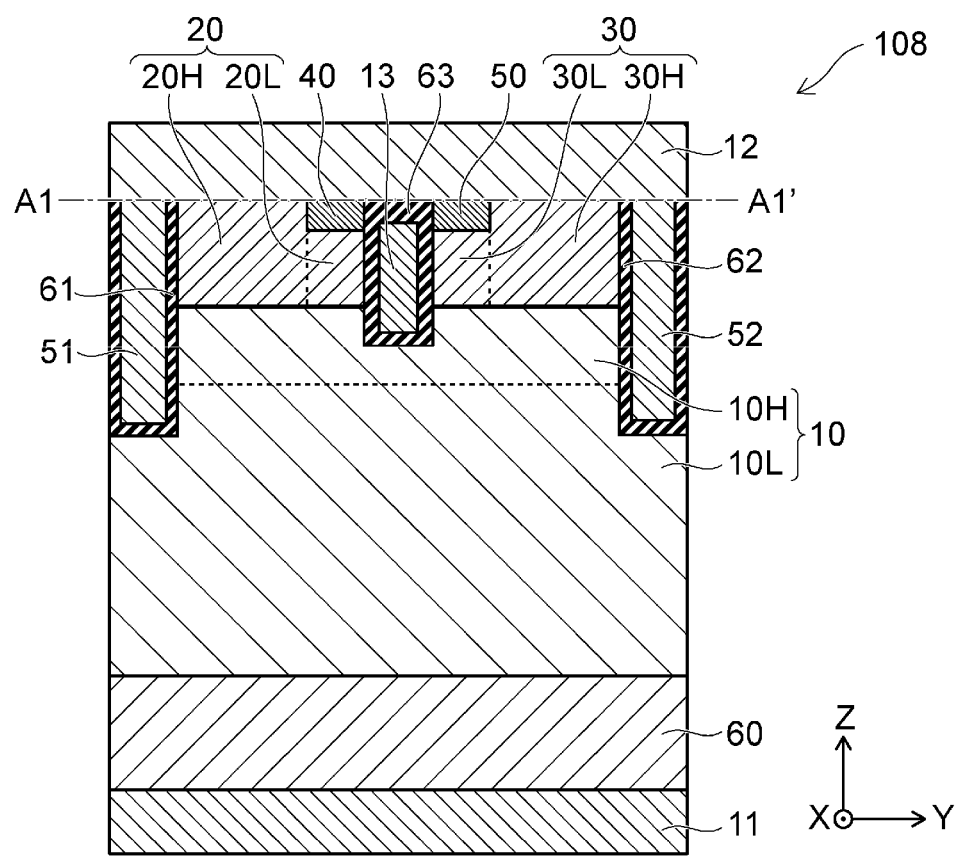
FIGS. 13A and 13B are diagrams illustrating a semiconductor device according to an eighth embodiment.
Figure 13B:
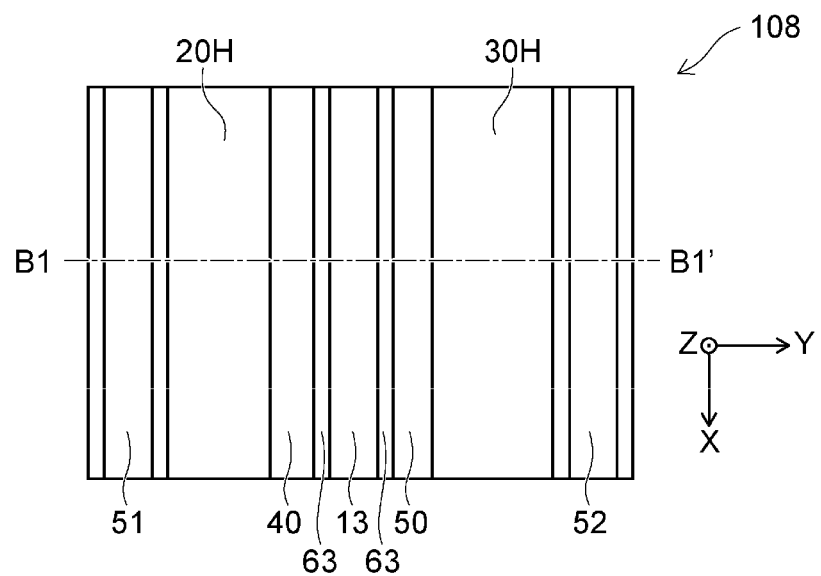

FIGS. 13A and 13B are diagrams illustrating a semiconductor device according to an eighth embodiment. FIG. 13A illustrates a cross-sectional view taken along a line B1-B1' in FIG. 13B. FIG. 13B illustrates a cross-sectional view taken along a line A1-A1' in FIG. 13A.

In a semiconductor device 108 according to the eighth embodiment, the p type base region 20 includes the portion 20H and the portion 20L. The p type base region 30 includes the portion 30H and the portion 30L.

With the presence of the portion 20H, the holes flowing into the p type base region 20 after turning off easily flow to the second electrode 12 via the portion 20H. With the presence of the portion 30H, the holes flowing into the p type base region 30 easily flow to the second electrode 12 via the portion 30H. Therefore, latch-up after turning off is more suppressed. The turning-off operation with a large amount of current can be made in the semiconductor device 108 so that latch-up is even more suppressed.

Ninth Embodiment

Figure 14A:
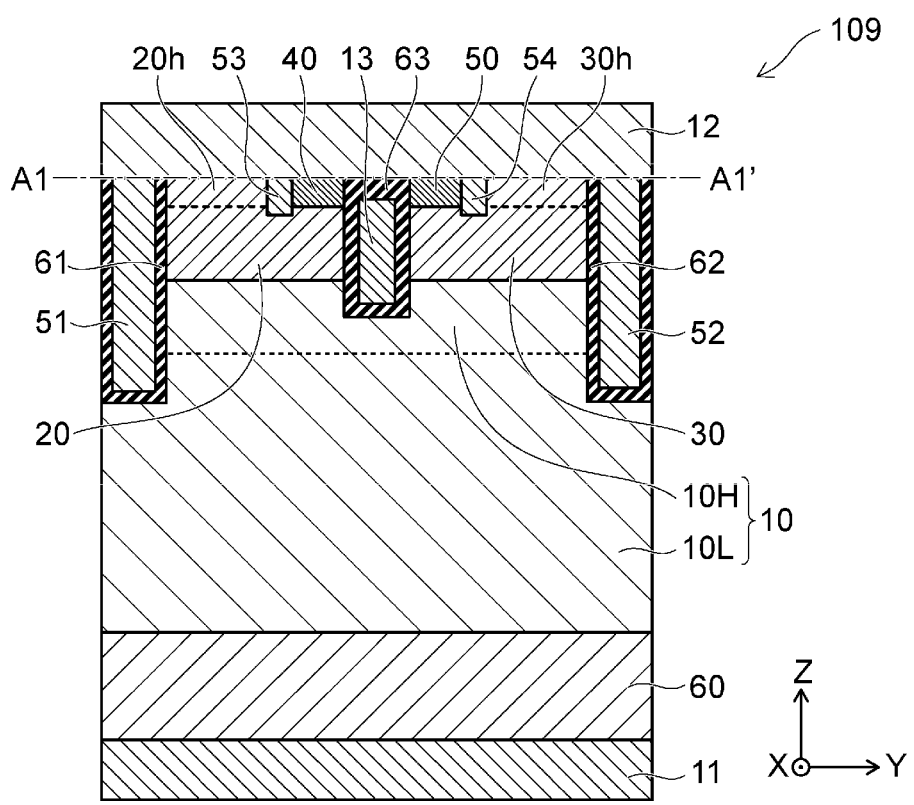
FIGS. 14A and 14B are diagrams illustrating a semiconductor device according to a ninth embodiment.
Figure 14B:
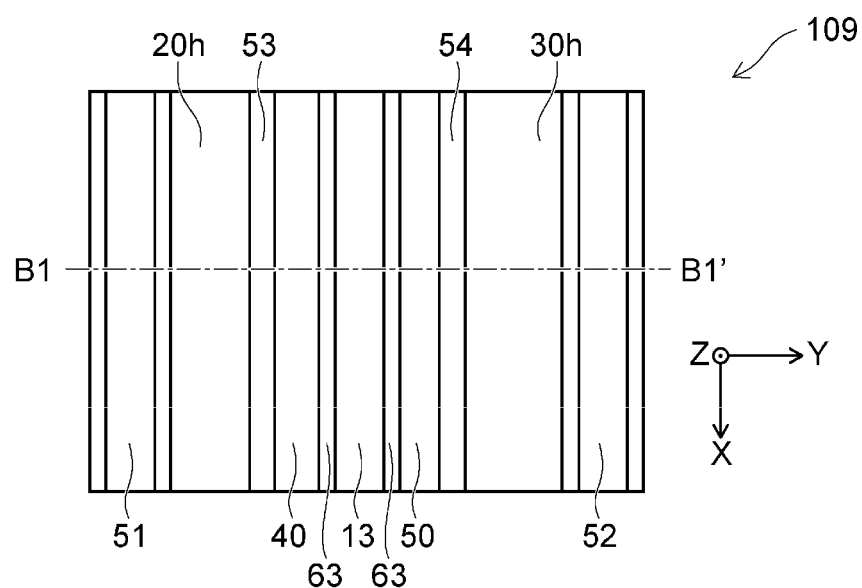

FIGS. 14A and 14B are diagrams illustrating a semiconductor device according to a ninth embodiment. FIG. 14A illustrates a cross-sectional view taken along a line B1-B1' in FIG. 14B. FIG. 14B illustrates a cross-sectional view taken along a line A1-A1' in FIG. 14A.

A semiconductor device 109 according to the ninth embodiment is further provided with the third connection region 53 and the fourth connection region 54. In alternative embodiments, one of the region 20h and the region 30h may be removed.

In the semiconductor device 109, the width of the $n^+$ type emitter region 40 in the Y axis direction is set by a distance between the third connection region 53 and the gate insulating film 63 in the Y axis direction. When the distance between the third connection region 53 and the gate insulating film 63 in the Y axis direction is made narrow, the width of the $n^+$ type emitter region 40 in the Y axis direction can be made fine. In addition, when the distance between the fourth connection region 54 and the gate insulating film 63 in the Y axis direction is made narrow, the width of the $n^+$ type emitter region 50 in the Y axis direction can be made fine.

In addition, in the semiconductor device 109, the holes flowing into the p type base region 20 after turning off can flow to the second electrode 12 via the third connection region 53. In addition, the holes flowing into the p type base region 30 can flow to the second electrode 12 via the fourth connection region 54. Therefore, latch-up after turning off is more suppressed. The turning-off operation with a large amount of current can be made in the semiconductor device 109 so that latch-up is even more suppressed.

Tenth Embodiment

Figure 15A:
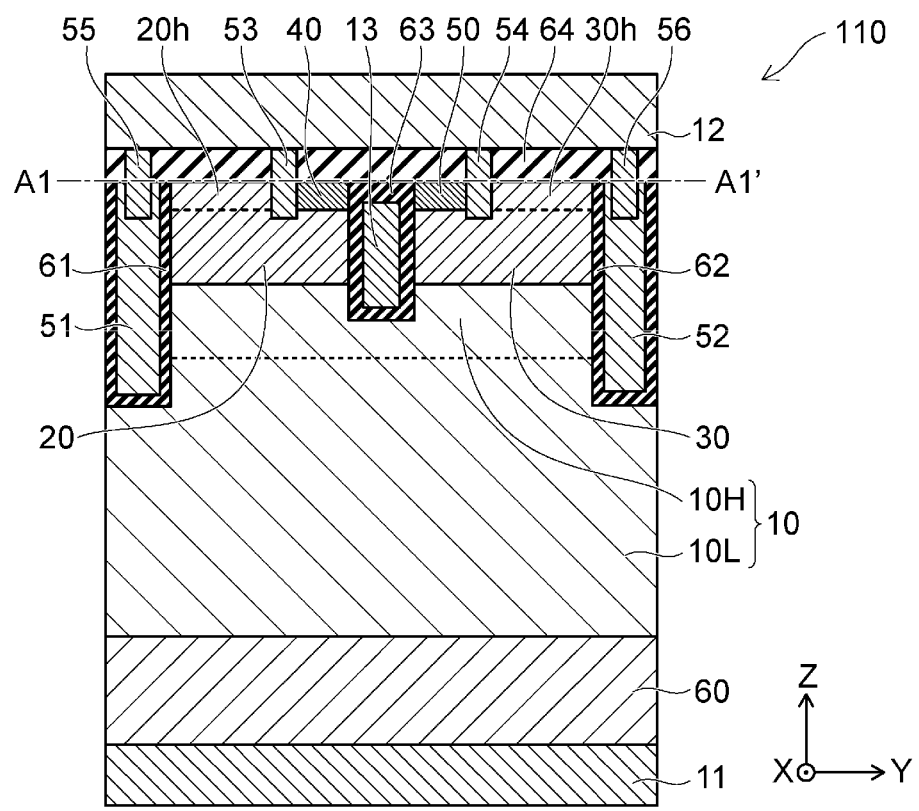
FIGS. 15A and 15B are diagrams illustrating a semiconductor device according to a tenth embodiment.
Figure 15B:
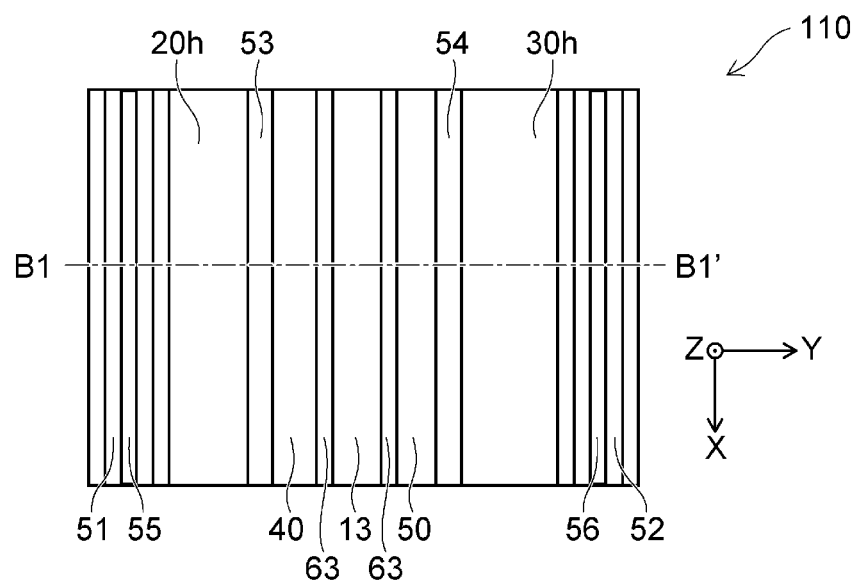

FIGS. 15A and 15B are diagrams illustrating a semiconductor device according to a tenth embodiment. FIG. 15A illustrates a cross-sectional view taken along a line B1-B1' in FIG. 15B. FIG. 15B illustrates a cross-sectional view taken along a line A1-A1' in FIG. 15A.

A semiconductor device 110 according to the tenth embodiment further includes the fifth connection region 55, the sixth connection region 56, and the insulating film 64.

In the semiconductor device 110, the fifth connection region 55 and the sixth connection region 56 are formed during a process of forming the third connection region 53 and the fourth connection region 54. Therefore, in a case where the third connection region 53 and the fourth connection region 54 are formed, a separately manufacturing process of directly connecting the first connection region 51 and the second connection region 52 to the second electrode 12 can be omitted.

Eleventh Embodiment

Figure 16A:
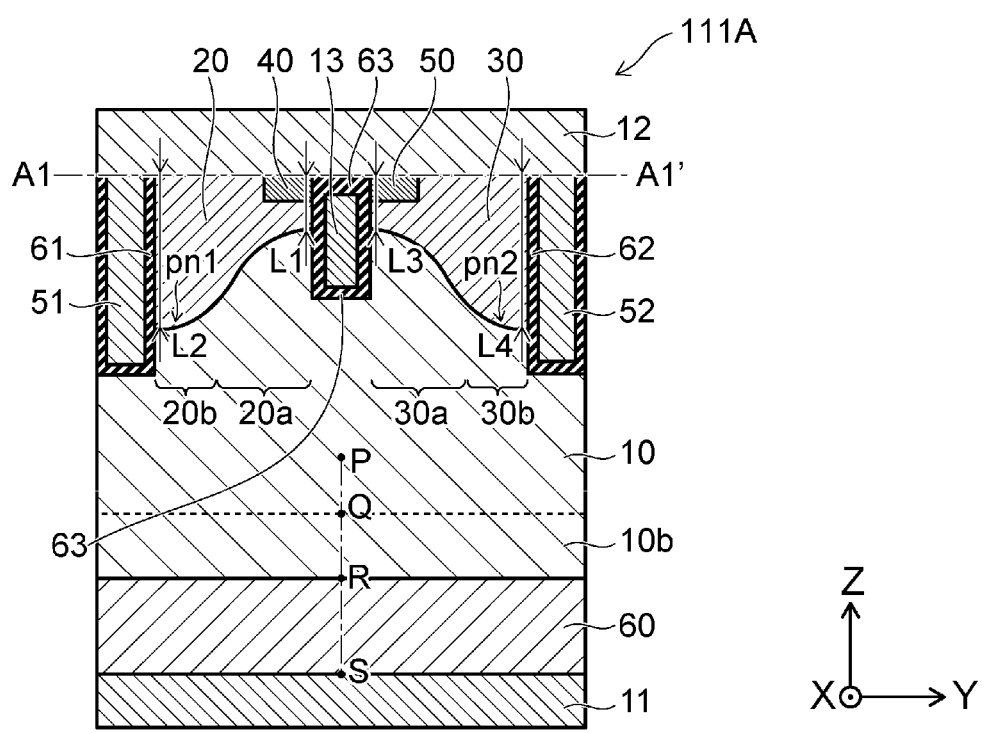
FIGS. 16A and 16B are diagrams illustrating a semiconductor device according to an eleventh embodiment.
Figure 16B:
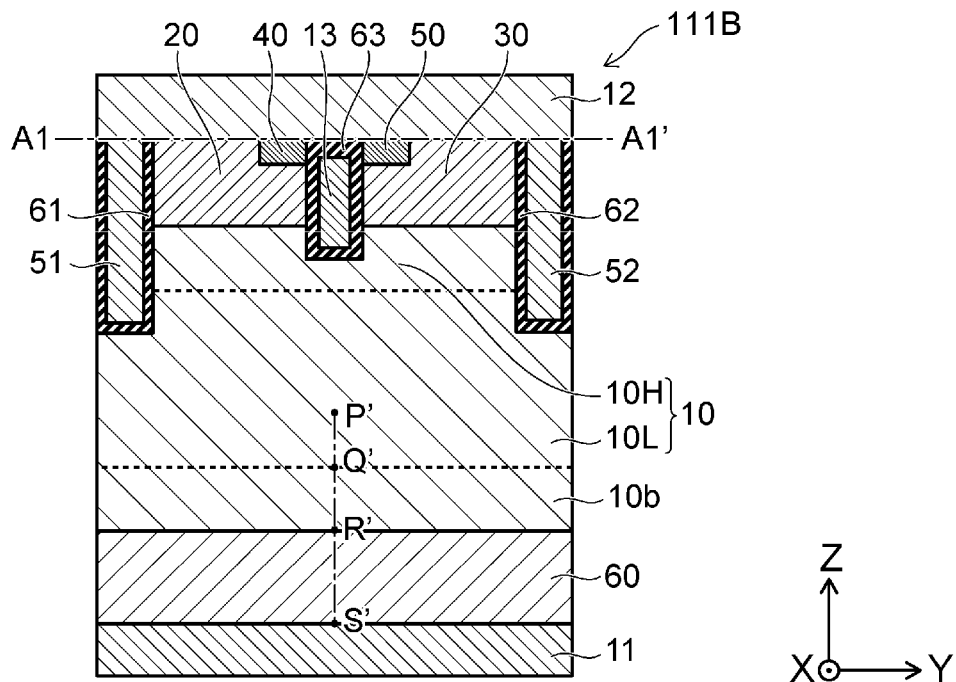
Figure 16C:
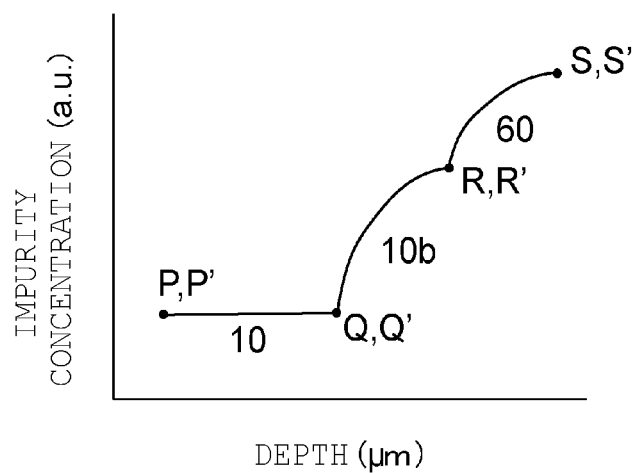
FIG. 16C is a graph illustrating a profile of an impurity concentration of a partial region of the semiconductor device according to the embodiment.

FIGS. 16A and 16B are diagrams illustrating a semiconductor device according to an eleventh embodiment. FIG. 16C is a graph illustrating a profile of an impurity concentration of a partial region of the semiconductor device according to the eleventh embodiment. The horizontal axis in FIG. 16C indicates a position in the Z axis direction, and the vertical axis indicates an impurity concentration (unit: arbitrary value (a.u.)) and a relative magnitude of the impurity concentration is illustrated.

In semiconductor devices 111A and 111B illustrated in FIG. 16A, the n type base region 10 includes a region of which the impurity concentration is increased toward the collector electrode 11. This region is called an n type buffer region 10b. The n type buffer region 10b has a predetermined length in the Z axis direction. The n type buffer region 10b extends in the X axis direction and the Y axis direction. The impurity concentration of the n type buffer region 10b is higher than that of the n type base region 10 excluding the n type buffer region 10b.

Since the n type buffer region 10b is provided in the n type base region 10, the length of the n type base region 10 (excluding the n type buffer region 10b) in the Z axis direction becomes thin, and the resistance thereof is further lowered. Therefore, the ON voltage in the ON state is further reduced in the semiconductor devices 111A and 111B.

Twelfth Embodiment

Figure 17A:
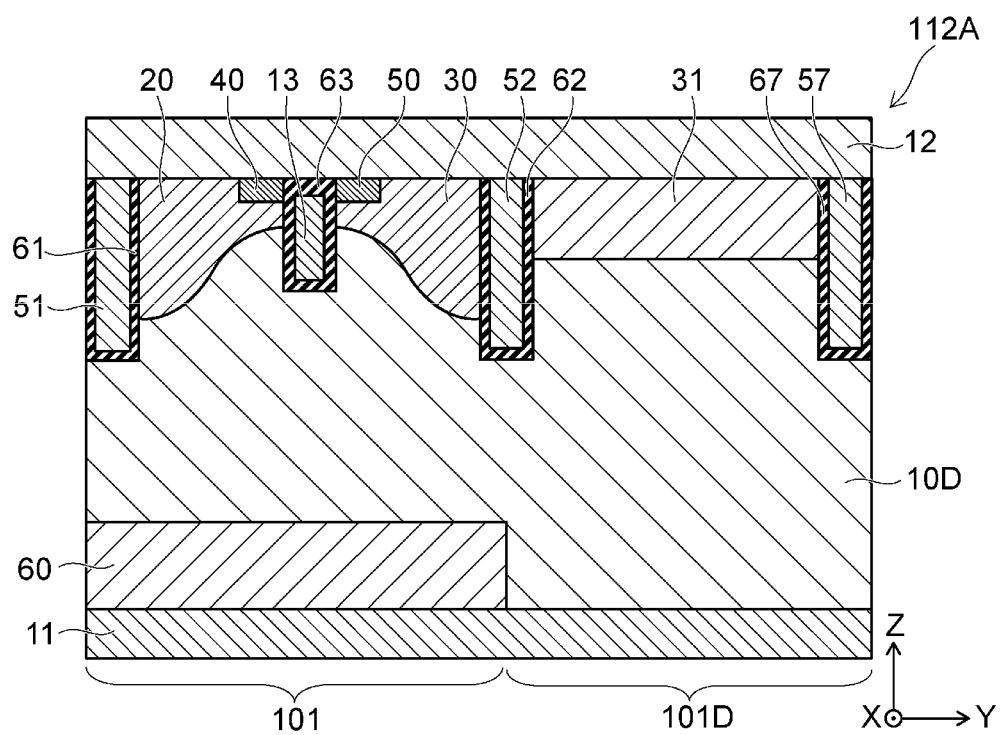
FIGS. 17A and 17B are plan views illustrating a semiconductor device according to a twelfth embodiment.
Figure 17B:
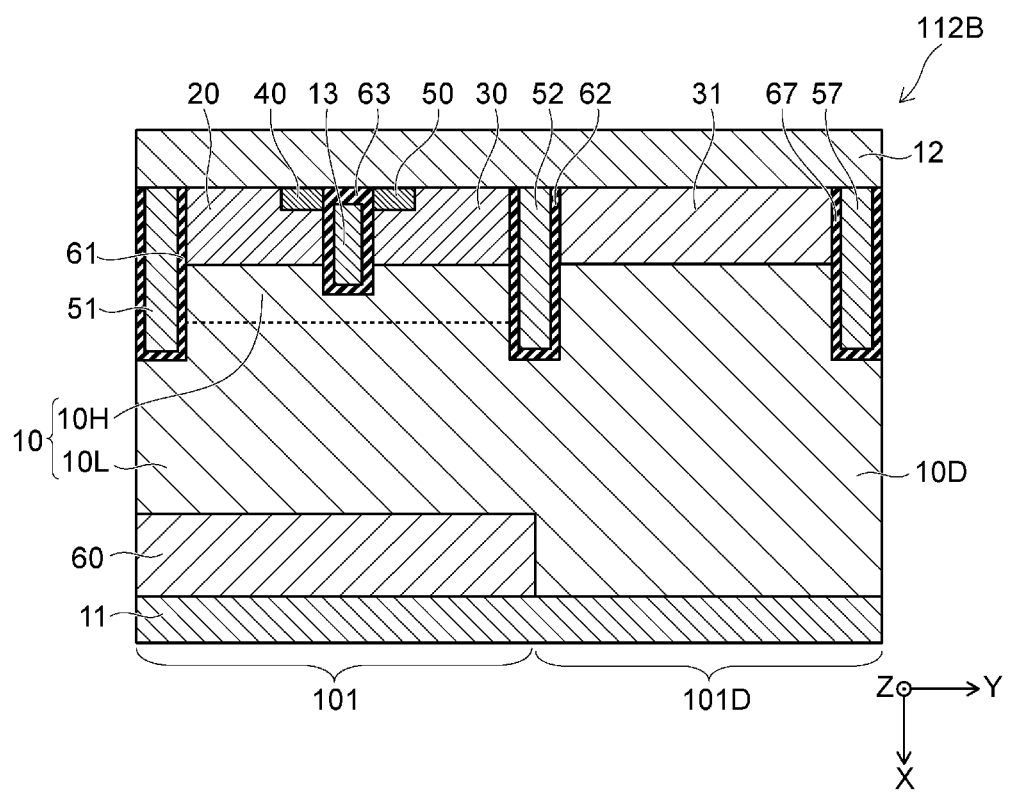

FIGS. 17A and 17B are diagrams illustrating a semiconductor device according to a twelfth embodiment.

A semiconductor device 112A illustrated in FIG. 17A includes the semiconductor device 101 and a diode region 101D. In the diode region 101D, the first electrode 11 is a cathode electrode, and the second electrode 12 is an anode electrode.

In the diode region 101D, an n type semiconductor region 10D is provided between the first electrode 11 and the second electrode 12. The impurity concentration of the n type semiconductor region 10D is equal to that of the n type base region 10. In the diode region 101D, a p type semiconductor region 31 is provided between the n type semiconductor region 10D and the second electrode 12. The p type semiconductor region 31 is provided between the second connection region 52 and a seventh connection region 57 in the Y axis direction. An insulating film 67 is provided between the seventh connection region 57 and the p type semiconductor region 31 and between the seventh connection region 57 and the n type semiconductor region 10D.

A semiconductor device 112B illustrated in FIG. 17B includes the semiconductor device 106 and the diode region 101D.

The semiconductor devices 112A and 112B are also included in the embodiment.

Thirteenth Embodiment

Figure 18A:
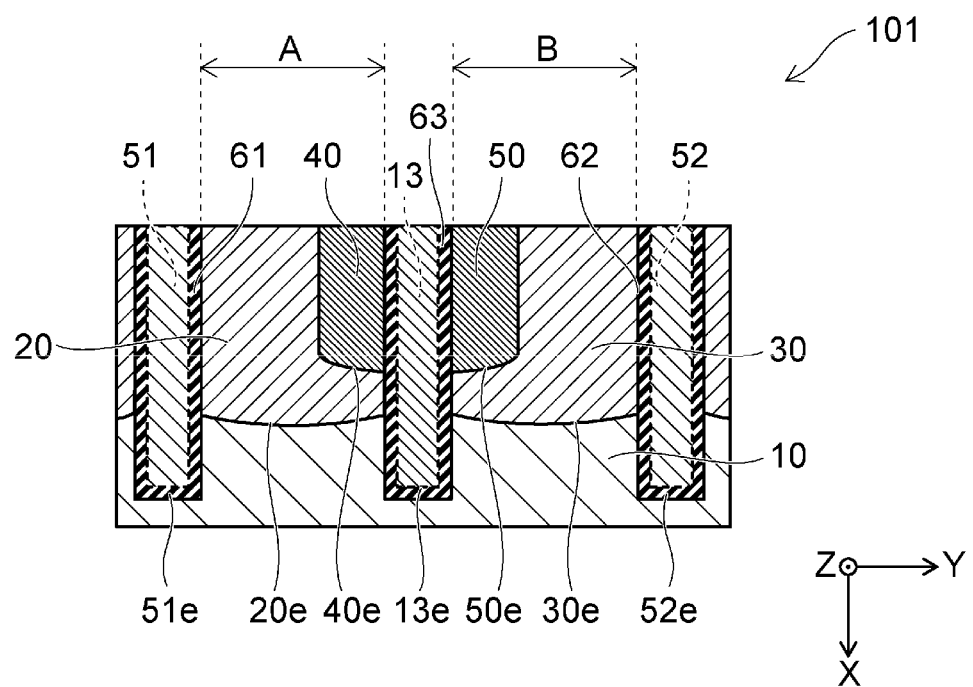
FIGS. 18A and 18B are plan views illustrating a semiconductor device according to a thirteenth embodiment.
Figure 18B:
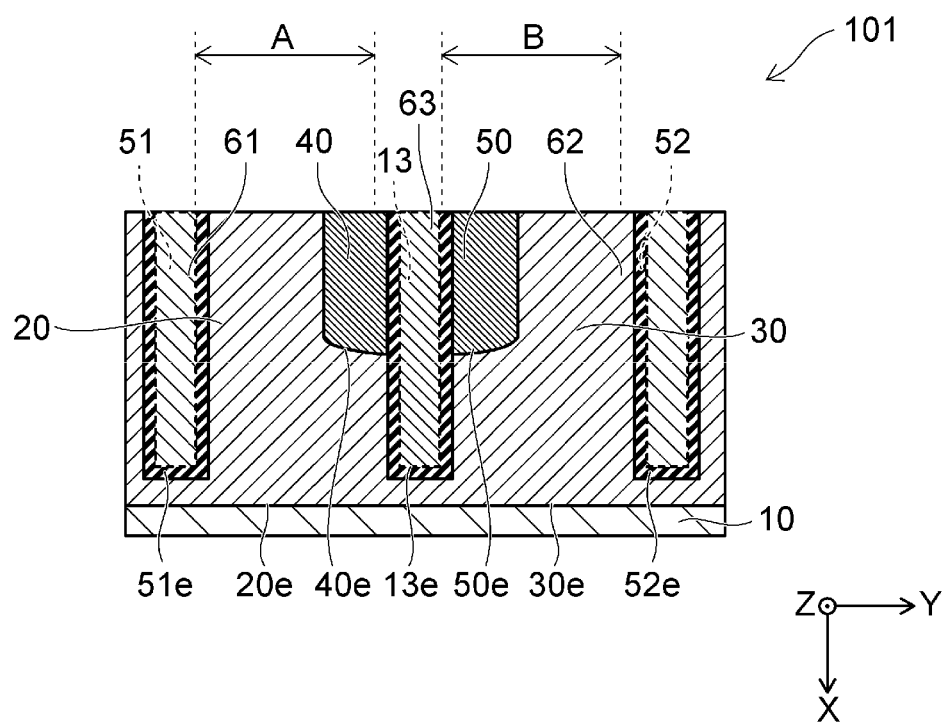

FIGS. 18A and 18B are plan views illustrating a semiconductor device according to a thirteenth embodiment.

FIGS. 18A and 18B illustrate a state of a portion in the X-Y plane below the second electrode 12 of the semiconductor device 101. FIG. 18A illustrates a first example of the thirteenth embodiment. FIG. 18B illustrates a second example of the thirteenth embodiment.

In the first example illustrated in FIG. 18A, an end portion 20e of the p type base region 20 is provided between the first connection region 51 and the gate electrode 13. An end portion 30e of the p type base region 30 is provided between the gate electrode 13 and the second connection region 52. An end portion 40e of the $n^+$ type emitter region 40 is positioned in the p type base region 20. An end portion 50e of the $n^+$ type emitter region 50 is positioned in the p type base region 30. In the first example, an end portion 51e of the first connection region 51 abuts the n type base region 10 via the insulating film 61. An end portion 13e of the gate electrode 13 abuts the n type base region 10 via the gate insulating film 63. An end portion 52e of the second connection region 52 abuts the n type base region 10 via the insulating film 62. In the first example, the p type base region 20 and the p type base region 30 are divided by the gate electrode 13.

In the second example illustrated in FIG. 18B, the end portion 20e of the p type base region 20 and the end portion 30e of the p type base region 30 are positioned on the outside of the end portions of the first connection region 51, the gate electrode 13, and the second connection region 52. In the second example, the p type base region 20 and the p type base region 30 are connected to each other on the outside of the end portions of the first connection region 51, the gate electrode 13, and the second connection region 52.

In the first to twelfth embodiments, the cross section or the plane in a portion of the semiconductor devices is exemplarily described. Even when the p type base region 20 and the p type base region 30 are connected to each other on the outside of the end portions of the first connection region 51, the gate electrode 13, and the second connection region 52, the individual p type base region illustrated in the partial cross section is defined as the p type base region 20 or the p type base region 30.

Terminal structures of the p type base regions 20 and 30, the $n^+$ type emitter regions 40 and 50, the first connection region 51, the gate electrode 13, and the second connection region 52 in the thirteenth embodiment may also be applied to the second to twelfth embodiments.

Even when the p type and the n type are reversed in the respective semiconductor devices in the embodiments, the same effect can be achieved.

The $p^+$ type collector region 60 may be removed from the respective semiconductor devices in the embodiments. In such a case, the respective semiconductor devices become a MOSFET (Metal Oxide Semiconductor Field Effect Transistor). In such a case, "emitter" is changed to "source", and "collector" is changed to "drain" in this embodiment.

A main component of the respective semiconductor region in the embodiments is silicon (Si) for example. The main component of the respective semiconductor region also may be silicon carbide (SiC) or gallium nitride (GaN). As an impurity element of the first conductivity type, phosphorus (P) or arsenic (As) is applied for example. As an impurity element of the second conductivity type, boron (B) is applied for example. In addition, while the n-channel IGBT is exemplified in this specification, a p-channel IGBT may be used.

In addition, "impurity concentration (atoms/$cm^3$)" means an effective concentration of the impurity element which contributes to conductivity of the semiconductor material. For example, in a case where donor impurities and acceptor impurities are contained in the semiconductor material, a concentration excluding a cancelling amount between the donor and the acceptor in the activated impurity element becomes an effective impurity concentration. In addition, the concentration of electrons or holes ionized from the effective impurity element is referred to as a carrier concentration. The magnitudes of the impurity concentrations according to the embodiments are compared to each other using a maximum value or an average value of the impurity concentration profile in the Z direction. The impurity concentration can be analyzed by SIMS analysis. The electrically-activated carrier concentration can be analyzed by SR analysis. The pn junction interface can be analyzed by SCM analysis, for example.

The materials of the first electrode 11, the second electrode 12, the gate electrode 13, the first connection region 51, the second connection region 52, the third connection region 53, the fourth connection region 54, the fifth connection region 55, and the sixth connection region 56 are, for example, a conductive material selected from the group consisting of at least aluminum (Al), titanium (Ti), nickel (Ni), tungsten (W), gold (Au), and polysilicon. In addition, the first insulating film 61, the second insulating film 62, or the gate insulating film 63 contains silicon oxide ($SiO_2$) or a silicon nitride ($Si_3N_4$) for example.

In the above-described embodiments, "on" in the expression "A is provided on B" may mean that A comes into contact with B, or that A is provided above B. In addition, "A is provided on B" also may mean a case where A and B are reversed and A is positioned below B, or a case where A and B are laterally arranged. This is because the structure of the semiconductor device is not changed when the semiconductor device according to the embodiment is rotated.

Hitherto, the embodiments have been described with reference to the specific examples. However, the embodiments are not limited to these specific examples. In other words, even when changes in design are appropriately added to these specific examples by a person skilled in the art, the changes fall within the scope of the embodiments as long as the examples have the features of the embodiments. The respective elements, arrangements, materials, conditions, shapes, and sizes thereof are not limited to those given as merely exemplary, but may be appropriately changed.

In addition, the respective elements provided in the above-described embodiments may be combined as much as technically possible. These combinations fall within the scope of the embodiments as long as the combinations contain the features of the embodiments. Otherwise, a person skilled in the art could conceive various modifications and changes in an ideal category of the embodiments. These modifications and changes are also considered as belonging to the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode spaced from the first electrode along a first direction;
   a first semiconductor region of a first conductivity type between the first electrode and the second electrode;
   a first conductive region between the first semiconductor region and the second electrode and electrically connected to the second electrode;
   a second conductive region between the first semiconductor region and the second electrode, aligned with the first conductive region in a second direction intersecting with the first direction and electrically connected to the second electrode;
   a third electrode between the first conductive region and the second conductive region and shorter in the first direction than each of the first and second conductive regions;
   a second semiconductor region of a second conductivity type between the first conductive region and the third electrode directly contacting the first semiconductor region of the first conductivity type;
   a third semiconductor region of the second conductivity type between the second conductive region and the third electrode directly contacting the first semiconductor region of the first conductivity type;
   a fourth semiconductor region of the first conductivity type between the second semiconductor region and the second electrode;
   a fifth semiconductor region of the first conductivity type between the third semiconductor region and the second electrode;
   a first insulating film between the first conductive region and the second semiconductor region;
   a second insulating film between the second conductive region and the third semiconductor region; and
   a third insulating film between the third electrode and the second semiconductor region and between the third electrode and the third semiconductor region, wherein
   a first portion of the second semiconductor region that is alongside the first insulating film extends farther in the first direction toward the first electrode than a second portion of the second semiconductor region that is alongside the third insulating film, and
   a first portion of the third semiconductor region that is alongside the second insulating film extends farther in the first direction toward the first electrode than a second portion of the third semiconductor region that is alongside the third insulating film.

2. The semiconductor device according to claim 1, wherein
   the third electrode extends farther in the first direction toward the first electrode than the second portions of the second and third semiconductor regions.

3. The semiconductor device according to claim 1, wherein
   each of the first portions of the second and third semiconductor regions extends farther in the first direction toward the first electrode than the third electrode.

4. The semiconductor device according to claim 3, wherein
   the first conductive region extends farther in the first direction toward the first electrode than the first portion of the second semiconductor region, and
   the second conductive region extends farther in the first direction toward the first electrode than the first portion of the third semiconductor region.

5. The semiconductor device according to claim 1, wherein
   mid-portions of the second and third semiconductor regions extend in the first direction toward the first electrode less than the first portion thereof but farther than the second portion thereof.

6. The semiconductor device according to claim 5, wherein
   impurity concentrations of the second and third semiconductor regions increase at locations of the second and third semiconductor regions that are closer to the second electrode.

7. The semiconductor device according to claim 5, wherein
   impurity concentrations of portions of the second semiconductor region that are aligned with the fourth semiconductor region in the first direction are less than impurity concentrations of portions of the second semiconductor region that are not, and
   impurity concentrations of portions of the third semiconductor region that are aligned with the fifth semiconductor region in the first direction are less than impurity concentrations of portions of the third semiconductor region that are not.

8. The semiconductor device according to claim 1, further comprising:
   a third conductive region between the second semiconductor region and the fourth semiconductor region and electrically connected to the second electrode; and
   a fourth conductive region between the third semiconductor region and the fifth semiconductor region and electrically connected to the second electrode.

9. The semiconductor device according to claim 8, further comprising:
   a fourth insulating film between the second electrode and the first and second conductive regions, between the second electrode and the third and fourth semiconductor regions, and between the second electrode and the third insulating film;
   a fifth conductive region extending through the fourth insulating film to electrically connect the second electrode and the first conductive region; and
   a sixth conductive region extending through the fourth insulating film to electrically connect the second electrode and the second conductive region, wherein the third conductive region extends through the fourth insulating film to be electrically connected to the second electrode, and the fourth conductive region extends through the fourth insulating film to be electrically connected to the second electrode.

10. The semiconductor device according to claim 1, wherein impurity concentrations of portions of the first semiconductor region are higher at locations closer to the first electrode than farther from the first electrode.

11. The semiconductor device according to claim 1, wherein the first, second, and third insulating films are in direct contact with the first semiconductor region.

12. The semiconductor device according to claim 1, wherein along a plane that is in contact with the second electrode, the first, second, and third insulating films are not in direct contact with the first semiconductor region.

13. The semiconductor device according to claim 1, further comprising a diode region, the diode region including:

the first and second electrodes;

the first semiconductor region in direct contact with the first electrode;

a sixth semiconductor region of the second conductivity type in direct contact with the second electrode and the first semiconductor region;

the second conductive region and the second insulating film, the second insulating film insulating the second conductive region from the sixth semiconductor region; and a seventh conductive region between the first semiconductor region and the second electrode, aligned with the second conductive region in the second direction, and electrically connected to the second electrode; and a fifth insulating film between the seventh conductive region and the sixth semiconductor region.

14. The semiconductor device according to claim 13, wherein each of the second and seventh conductive regions extends farther in the first direction toward the first electrode than any portion of the sixth semiconductor region.

15. A semiconductor device comprising:

a first electrode;

a second electrode spaced from the first electrode along a first direction;

a first semiconductor region of a first conductivity type between the first electrode and the second electrode;

at least two conductive regions between the first semiconductor region and the second electrode and electrically connected to the second electrode;

a third electrode between the two conductive regions, the third electrode being shorter in the first direction than each of the two conductive regions;

a second semiconductor region of a second conductivity type between each of the two conductive regions and the third electrode directly contacts the first semiconductor region of the first conductivity type;

a third semiconductor region of the first conductivity type between each of the second semiconductor region and the second electrode; and a first insulating film between each of the two conductive regions and the second semiconductor region; and a second insulating film between the third electrode and the second semiconductor region and between the third electrode and the third semiconductor region, wherein a first portion of each of the two second semiconductor regions that is alongside the first insulating film extends farther in the first direction toward the first electrode than a second portion of each of the two second semiconductor regions that is alongside the second insulating film.

* * * * *